(12) United States Patent
Gu et al.

(10) Patent No.: US 12,074,449 B2
(45) Date of Patent: Aug. 27, 2024

(54) WIRELESS POWER TRANSMITTER INCLUDING MINIATURIZED INVERTER FOR REDUCING HARMONICS

(71) Applicant: SAMSUNG ELECTRONICS CO., LTD., Suwon-si (KR)

(72) Inventors: Beomwoo Gu, Suwon-si (KR); Jaeseok Park, Suwon-si (KR); Jaehyun Park, Suwon-si (KR); Youngho Ryu, Suwon-si (KR); Jungkyu Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/956,443

(22) Filed: Sep. 29, 2022

(65) Prior Publication Data
US 2023/0094440 A1 Mar. 30, 2023

Related U.S. Application Data

(63) Continuation of application No. PCT/KR2022/014534, filed on Sep. 28, 2022.

(30) Foreign Application Priority Data

Sep. 29, 2021 (KR) .................. 10-2021-0128895

(51) Int. Cl.
*H02J 50/12* (2016.01)
*H03H 1/00* (2006.01)

(52) U.S. Cl.
CPC ............... *H02J 50/12* (2016.02); *H03H 1/00* (2013.01); *H03H 2001/0035* (2013.01)

(58) Field of Classification Search
CPC ............ H02J 50/12; H02J 50/40; H02J 50/50; H02M 7/4815
See application file for complete search history.

(56) References Cited

U.S. PATENT DOCUMENTS 10,263,537 B2  4/2019  Lin et al.
10,644,613 B2  5/2020  Aldhaher et al.
(Continued)

FOREIGN PATENT DOCUMENTS

JP  2016-067135  4/2016
JP  2018-007462  1/2018
(Continued)

OTHER PUBLICATIONS

Search Report and Written Opinion dated Jan. 4, 2023 issued in International Patent Application No. PCT/KR2022/014534.

*Primary Examiner* — Ryan Johnson
(74) *Attorney, Agent, or Firm* — Nixon & Vanderhye, P.C.

(57) ABSTRACT

An example wireless power transmitter may include a transistor configured to output an amplified signal, a first capacitor coupled to the transistor in parallel, a first LC resonant circuit coupled to the transistor in parallel, a third capacitor having a first end coupled to an output terminal of the transistor and the first LC resonant circuit, a feeding coil coupled to a second end of the third capacitor in series, and having at least a part configured to form a second LC resonant circuit with the third capacitor, and a transmission resonator including a transmission coil and a fourth capacitor coupled to the transmission coil in series. At least a part of the transmission coil may be magnetically coupled with the feeding coil, and at least a part of power received from the feeding coil may be output to an outside through the transmission resonator.

19 Claims, 10 Drawing Sheets

(56) References Cited

U.S. PATENT DOCUMENTS

| | | |
|---|---|---|
| 2003/0007372 A1 | 1/2003 | Porter et al. |
| 2013/0234503 A1* | 9/2013 | Ichikawa ............... H02J 50/90 |
| | | 307/104 |
| 2014/0167522 A1* | 6/2014 | Lee ...................... H05K 7/2039 |
| | | 307/104 |
| 2014/0175868 A1 | 6/2014 | Sakakibara et al. |
| 2016/0094046 A1 | 3/2016 | Kato |
| 2017/0055585 A1 | 3/2017 | Fursa et al. |
| 2017/0324277 A1 | 11/2017 | Mitcheson et al. |
| 2017/0338696 A1 | 11/2017 | Bae et al. |
| 2018/0034383 A1* | 2/2018 | Aldhaher ............... H03F 3/2176 |
| 2018/0054090 A1 | 2/2018 | Von Novak, III et al. |
| 2018/0152049 A1 | 5/2018 | Jeon et al. |
| 2018/0212464 A1 | 7/2018 | Liu |
| 2019/0058458 A1 | 2/2019 | Hong |
| 2019/0173316 A1 | 6/2019 | Shin et al. |
| 2020/0287413 A1 | 9/2020 | Peretz |
| 2021/0359551 A1 | 11/2021 | Yankowitz |

FOREIGN PATENT DOCUMENTS

| | | |
|---|---|---|
| KR | 10-2016-0070539 | 6/2016 |
| KR | 10-2018-0060102 | 6/2018 |
| KR | 10-2018-0064577 | 6/2018 |
| KR | 10-2019-0067018 | 6/2019 |
| KR | 10-2021-0049902 | 5/2021 |
| WO | 2020/069198 | 4/2020 |
| WO | 2021/081426 | 4/2021 |

\* cited by examiner

WIRELESS POWER TRANSMITTER INCLUDING MINIATURIZED INVERTER FOR REDUCING HARMONICS

CROSS-REFERENCE TO RELATED APPLICATIONS

This application is a continuation of International Application No. PCT/KR2022/014534 designating the United States, filed on Sep. 28, 2022, in the Korean Intellectual Property Receiving Office and claiming priority to Korean Patent Application No. 10-2021-0128895, filed on Sep. 29, 2021, in the Korean Intellectual Property Office, the disclosures of which are incorporated by reference herein in their entireties.

BACKGROUND

Field

The disclosure relates to a wireless power transmitter including a miniaturized inverter for reducing harmonics.

Description of Related Art

An inverter is a device that converts direct current (DC) power into alternating current (AC) power. To increase the efficiency of the inverter, various matching circuits may be coupled to the output terminal of the inverter.

An example of an inverter is a class E inverter (or a class E power amplifier (PA)). Since the class E inverter operates under a zero-voltage switching (ZVS) condition and a zero-derivative voltage switching (ZDS) condition, it may efficiently operate at a high switching frequency (e.g., 1 MHz or higher).

A class $EF_2$ inverter has a form in which an LC resonant circuit, including one inductor and one capacitor coupled in series to each other, is coupled in parallel to a load network of a class E inverter.

An inverter may include a transistor, and various matching networks (e.g., a matching circuit) may be disposed between the transistor and a transmission coil. For example, a series LC resonant circuit and an LCC network including one inductor and two capacitors may be disposed between the transistor and the transmission coil. The two capacitors of the LCC network together with the transmission coil may form a resonator. In this case, as harmonic current flows through a path of the inductor (e.g., $L_{1p}$ of FIG. 1A to be described later) and a parallel capacitor (e.g., $C_{pp}$ of FIG. 1A to be described later) of the LCC network, electromagnetic interference (EMI) may occur. To prevent the EMI from degrading the performance of the transmission coil (e.g., $L_{tx}$ of FIG. 1A to be described later), using an EMI shield can (or EMI shield coating) for the parallel capacitor $C_{pp}$ may be considered. However, to prevent degradation of the performance of the transmission coil $L_{tx}$ having a high quality factor (Q-factor), the parallel capacitor $C_{pp}$ needs to be disposed adjacent to the transmission coil $L_{tx}$. Accordingly, it may be difficult to use the EMI shield can for the parallel capacitor $C_{pp}$.

SUMMARY

Embodiments of the disclosure provide a wireless power transmitter including a feeding coil between a transistor and a resonator.

Embodiments of the disclosure provide a wireless power transmitter including a transformer between a transistor and a resonator.

According to various example embodiments, a wireless power transmitter may include: a transistor configured to output an amplified signal based on an input signal and a driving voltage, a first capacitor coupled to the transistor in parallel, a first LC resonant circuit coupled to the transistor in parallel and including a first inductor and a second capacitor coupled to the first inductor in series, a third capacitor having a first end coupled to an output terminal of the transistor and the first LC resonant circuit, a feeding coil coupled to a second end of the third capacitor in series, and having at least a part configured to form a second LC resonant circuit with the third capacitor, and a transmission resonator including a transmission coil and a fourth capacitor coupled to the transmission coil in series. At least a part of the transmission coil may be magnetically coupled with the feeding coil, and at least a part of power received from the feeding coil may be output to an outside through the transmission resonator.

According to various example embodiments, a wireless power transmitter may include: a transistor configured to output an amplified signal based on an input signal and a driving voltage, a first capacitor coupled to the transistor in parallel, a first LC resonant circuit coupled to the transistor in parallel and including a first inductor and a second capacitor coupled to the first inductor in series, a transformer coupled to an output terminal of the transistor and including a first coil coupled to the first LC resonant circuit in parallel and a second coil wound on a ferrite core on which the first coil is wound, a third capacitor coupled to the second coil in series, a feeding coil coupled to the third capacitor in series and configured to form a second LC resonant circuit with the third capacitor, and a transmission resonator including a transmission coil and a fourth capacitor coupled to the transmission coil in series. At least a part of the transmission coil may be magnetically coupled with the feeding coil, and at least a part of power received from the feeding coil may be output to an outside through the transmission resonator.

According to various example embodiments, a wireless power transmitter may reduce the occurrence of electromagnetic interference (EMI) without a parallel capacitor $C_{pp}$, while providing the function of a series LC resonant circuit of a class $EF_2$ inverter, through a feeding coil disposed between a transistor and a resonator. Further, the omission of the parallel capacitor $C_{pp}$ enables miniaturization of an inverter.

According to various example embodiments, the wireless power transmitter may reduce the occurrence of EMI without the parallel capacitor $C_{pp}$ through a transistor, and a transformer disposed between the resonator and a feeding coil.

Various effects achieved by the disclosure are not limited to the above-described effects.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
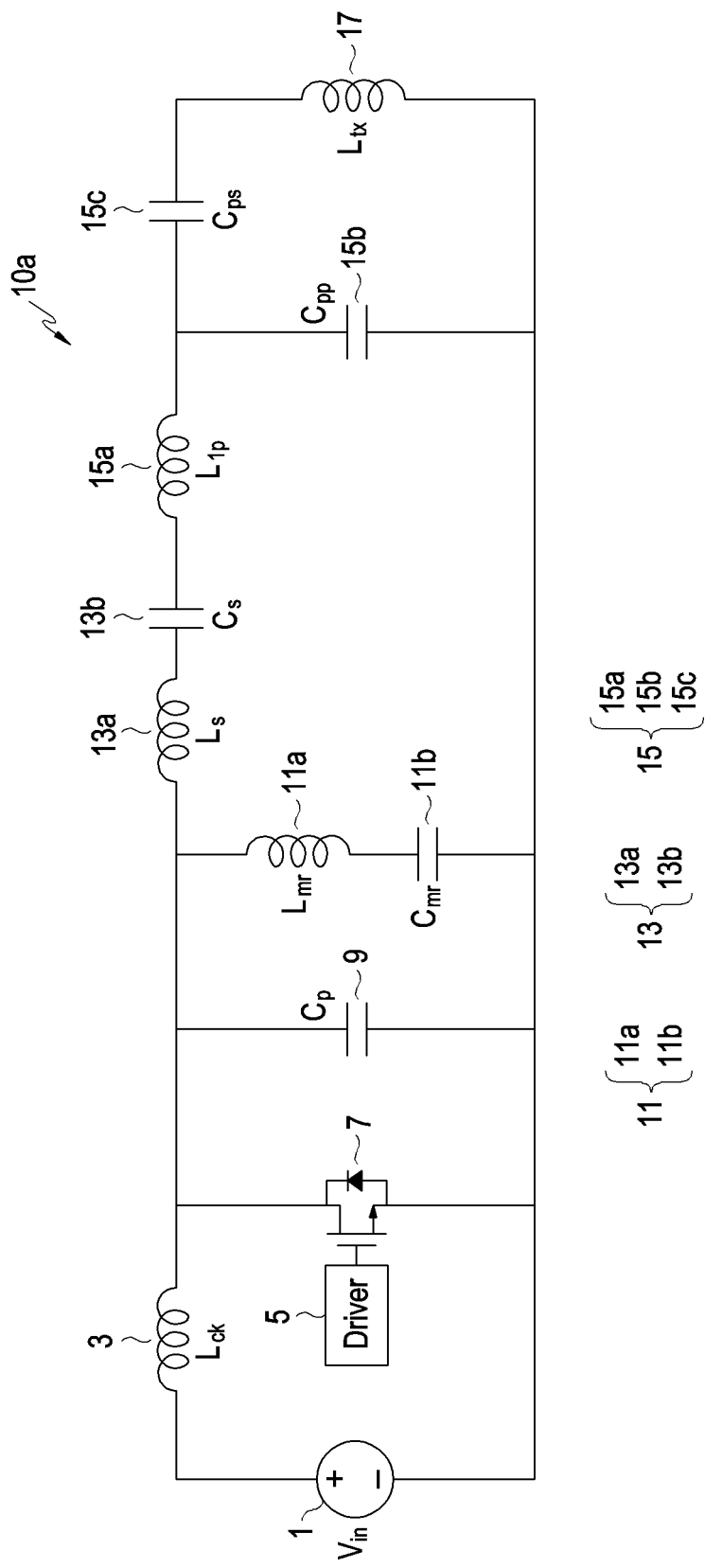
FIG. 1A illustrates an example power transmission system according to a comparative example.

FIG. 1A illustrates an example power transmission system 10a according to a comparative example.

The power transmission system 10a may include an input power supply 1, a choke inductor (or a radio frequency (RF) choke inductor) $L_{ck}$ 3, a driver (or a gate driver) 5, a transistor 7, a first capacitor $C_p$ 9, a first LC resonant circuit 11, a second LC resonant circuit 13, an LCC network 15, and a transmission coil $L_{tx}$ 17.

The transistor 7 may operate by receiving a DC voltage $V_{in}$ as a driving voltage from the input power supply 1. The transistor 7 may be turned on or off by receiving an input signal in the form of a pulse (e.g., a square wave) from the driver 5 through an input terminal (e.g., a gate). The transistor 7 may include a metal oxide semiconductor field effect transistor (MOSFET).

The choke inductor 3 may block transmission of a radio frequency (RF) signal from the input power supply 1 to the transistor 7 so that only DC current is transmitted to the transistor 7.

The first capacitor 9 may be coupled in parallel to the transistor 7, and may be discharged or charged while the transistor 7 is turned on or off. The first capacitor 9 may be referred to as a shunt capacitor. The first capacitor 9 may be a separate capacitor coupled in parallel to the transistor 7, and may be described conceptually as encompassing the internal capacitance (e.g., drain-source capacitance $C_{ds}$) of the transistor 7.

The transistor 7 may be turned on or off by receiving an input signal from the driver 5. For example, the transistor 7 may be turned on or off at an operating frequency (e.g., $f_s$ to be described later) of the input signal, based on the input signal received from the driver 5. Based on the transistor 7 being turned on or off, RF power may be generated. The generated RF power may be transmitted to the first LC resonant circuit 11 and/or the second LC resonant circuit 13 through an output terminal of the transistor 7. More specifically, when the transistor 7 is turned on (e.g., when the transistor 7 is saturated), the transistor 7 may be electrically shorted and thus interpreted as a short circuit for a ground coupled to a source. A voltage at the output terminal of the transistor 7 may be interpreted as zero. Current flowing in the transistor 7 through the choke inductor 3 may gradually increase. Then, when the transistor 7 is turned off, the current flowing through the choke inductor 3 may be directed to the first capacitor 9, and as the first capacitor 9 is gradually charged, the voltage of the output terminal of the transistor 7 (e.g., voltages at both ends of the first capacitor 9) may increase until it reaches a maximum value. Subsequently, as the first capacitor 9 is gradually discharged, current from the first capacitor 9 may flow to the first LC resonant circuit 11 and/or the second LC resonant circuit 13 through the output terminal of the transistor 7, and the voltages at both ends of the first capacitor 9 may gradually decrease. Before the transistor 7 is turned off and then turned on again (e.g. before current begins to flow again into the transistor 7 through the choke inductor 3), the transistor 7, the capacitor 9, and the input signal may be set so that the voltage at the output terminal of the transistor 7 (e.g. the voltages at both ends of the capacitor 9 and the drain-source voltage of the transistor 7) may gradually decrease to zero and a decrement of the voltage at the output terminal of the transistor 7 becomes zero. Then, when the transistor 7 is turned on again, the current flowing through the choke inductor 3 may be directed to the transistor 7, and the voltage at the output terminal of the transistor 7 may be maintained to be zero while the transistor 7 is in an on state. As described above, while the transistor 7 is in the on state, the voltage at the output terminal of the transistor 7 is zero, whereas while the transistor 7 is in an off state, the current flowing through the choke inductor 3 is directed to the first capacitor 9, the current flowing in the transistor 7 through the choke inductor 3 is zero (in other words, a period during which the voltage at the output terminal of the transistor 7 is non-zero does not overlap with a period during which the drain-source current is non-zero), and thus, the power consumption of the transistor 7 may ideally be zero. In a non-ideal case, however, since the transistor 7 generates RF power based on being turned on or off, the generated RF power may include second or higher harmonic components as well as a desired frequency component (e.g., a fundamental component of an operating frequency). The duty cycle of the transistor 7 may be set, for example, to 50% based on the input signal.

The first LC resonant circuit 11 may be coupled in parallel to the first capacitor 9 and/or the transistor 7. The first LC resonant circuit 11 may include a first inductor $L_{mr}$ 11a and a second capacitor $C_{mr}$ 11b coupled in series to each other. The first inductor 11a and the second capacitor 11b may have appropriate element values such that the resonant frequency of the first LC resonant circuit 11 corresponds to a second harmonic frequency $2f_s$ of the operating frequency $f_s$ of the input signal. The first LC resonant circuit 11 may be electrically interpreted as a short circuit at the second harmonic frequency $2f_s$. The first LC resonant circuit 11 may serve as a second harmonic filter (e.g., a band-stop filter) that prevents transmission of the second harmonic component of the RF power generated from the transistor 7 to the second LC resonant circuit 13 based on being electrically short-circuited at the second harmonic frequency $2f_s$.

The second LC resonant circuit 13 may be coupled to the output terminal of the transistor 7. The second LC resonant circuit 13 may include a second inductor $L_s$ 13a and a third capacitor $C_s$ 13b coupled in series to each other. The second inductor 13a and the third capacitor 13b may have appropriate element values such that the resonant frequency of the second LC resonant circuit 13 corresponds to the operating frequency $f_s$ of the input signal (e.g., a fundamental frequency (or first harmonic frequency) $f_s$). The second LC resonant circuit 13 may be electrically interpreted as a short circuit at the first harmonic frequency $f_s$. The second LC resonant circuit 13 may serve as a band-pass filter (or a low-pass filter) that passes the fundamental component (or the first harmonic component) of the RF power generated from the transistor 7 based on being electrically short-circuited at the first harmonic frequency $f_s$.

The LCC network 15 may be coupled to the second LC resonant circuit 13. The LCC network 15 may include one inductor (e.g., a third inductor $L_{1p}$ 15a) and two capacitors (e.g., a fourth capacitor $C_{pp}$ 15b and a fifth capacitor $C_{ps}$ 15c). The LCC network 15 may provide impedance matching such that an output impedance (e.g., impedance facing the second LC resonant circuit 13) matches the impedance of the transmission coil $L_{tx}$ 17.

The transmission coil $L_{tx}$ 17 together with at least a part of the LCC network 15 may form a transmission resonator of the power transmission system 10a. For example, the transmission coil 17, the fourth capacitor 15b, and the fifth capacitor 15c may form the transmission resonator. The resonant frequency $f_r$ of the transmission resonator may be set to correspond to the operating frequency $f_s$ of the input signal.

According to the comparative example, the fourth capacitor 15b, the fifth capacitor 15c, and the transmission coil 17 may form a loop through which high current for forming a magnetic field flows to the outside. In this case, harmonic current may flow through the path of the third inductor 15a and the fourth capacitor 15b, thus causing EMI. Because the third inductor 15a and at least some of the components shown on the left side of the third inductor 15a are disposed on a power amplifier (PA) circuit board, whereas the fourth capacitor 15b forms a resonator, it may be difficult to apply an EMI shield can to the fourth capacitor 15b.

Figure 1B:
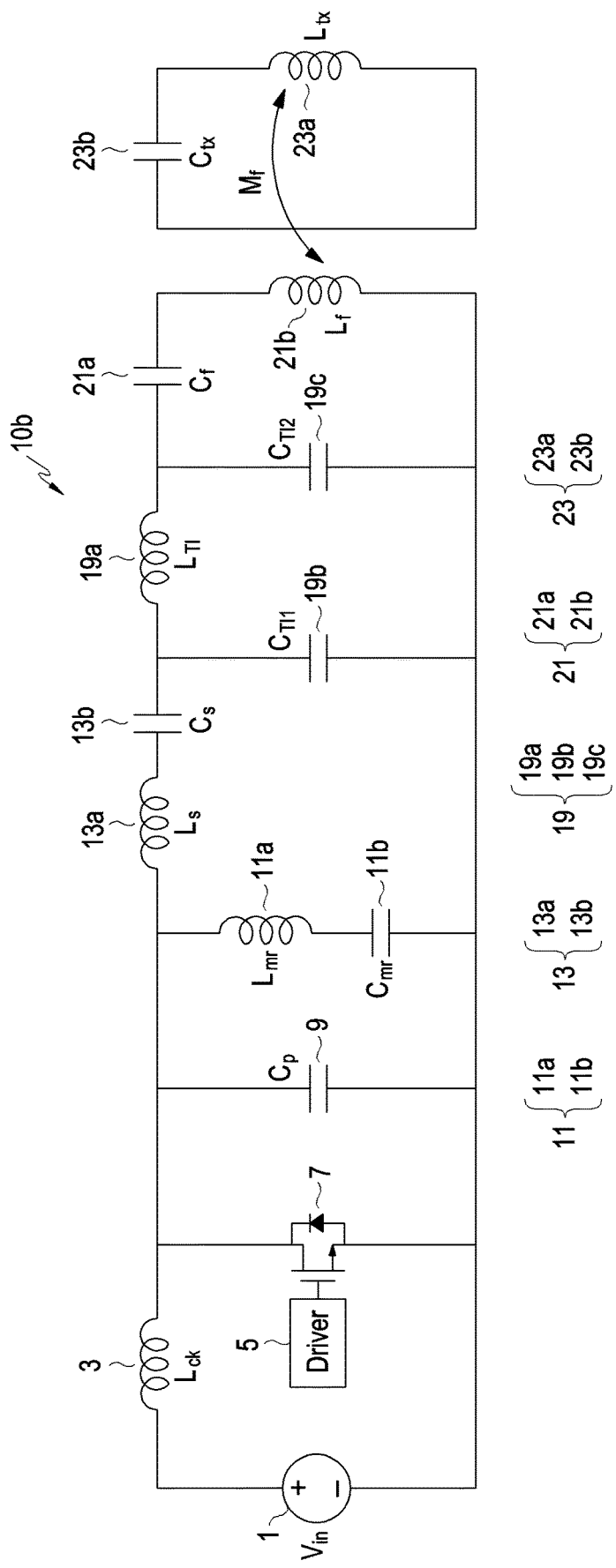
FIG. 1B illustrates another example power transmission system according to a comparative example.

FIG. 1B illustrates another example power transmission system 10b according to a comparative example.

The power transmission system 10b may include the input power supply 1, the choke inductor $L_{ck}$ 3, the driver 5, the transistor 7, the first capacitor $C_p$ 9, the first LC resonant circuit 11, the second LC resonant circuit 13, a matching network 19, a feeding circuit 21, and a transmission resonator 23.

Among the components illustrated in FIG. 1B, a description of components of FIG. 1B having the same reference numerals as the components of FIG. 1A will not be repeated here.

The power transmission system 10b of FIG. 1B is different from the power transmission system 10a of FIG. 1A, in that the matching network 19 and the feeding circuit 21 are included instead of the LCC network 15, and the transmission resonator 23 includes a sixth capacitor $C_{tx}$ 23b and a transmission coil 23a.

The matching network 19 may be coupled to the second LC resonant circuit 13. The matching network 19 may include one inductor (e.g., a fourth inductor $L_{TI}$ 19a) and two capacitors (e.g., a seventh capacitor $C_{TI1}$ 19b and an eighth capacitor $C_{TI2}$ 19c). The matching network 19 may provide impedance matching such that an output impedance (e.g., an impedance facing the second LC resonant circuit 13) matches to the input impedance of the feeding circuit 21 (e.g., an impedance facing the feeding circuit 21).

The feeding circuit 21 may be coupled to the matching network 19. The feeding circuit 21 may include a ninth capacitor $C_f$ 21a and a feeding coil $L_f$ 21b. The feeding coil 21b may be magnetically coupled to the transmission coil $L_{tx}$ 23a of the transmission resonator 23. The illustrated '$M_f$' represents a mutual inductance between the feeding coil 21b and the transmission coil 23a. Based on an induced magnetic field generated from the feeding coil 21b, an induced electromotive force may be generated in the transmission coil 23a to output AC current from the transmission coil 23a.

Therefore, wireless power may be transmitted from the feeding coil 21b to the transmission resonator 23.

The transmission resonator 23 may include the transmission coil 23a and the sixth capacitor $C_{tx}$ 23b. The transmission resonator 23 may form an externally induced magnetic field based on the wireless power received from the feeding coil 21b. Therefore, at least a part of the power received from the feeding coil 21b may be output to the outside through the transmission resonator 23.

Compared to the power transmission system 10a of FIG. 1A, the power transmission system 10b of FIG. 1B does not include the fourth capacitor 15b causing EMI to prevent the occurrence of harmonic current-incurred EMI. However, since more components such as the feeding circuit 21 are used, the power transmission system 10b increases in size.

In this disclosure, a wireless power transmitter including fewer components than the power transmission system 10b of FIG. 1B in spite of including a feeding circuit (and/or a transformer) will be described.

Figure 2A:
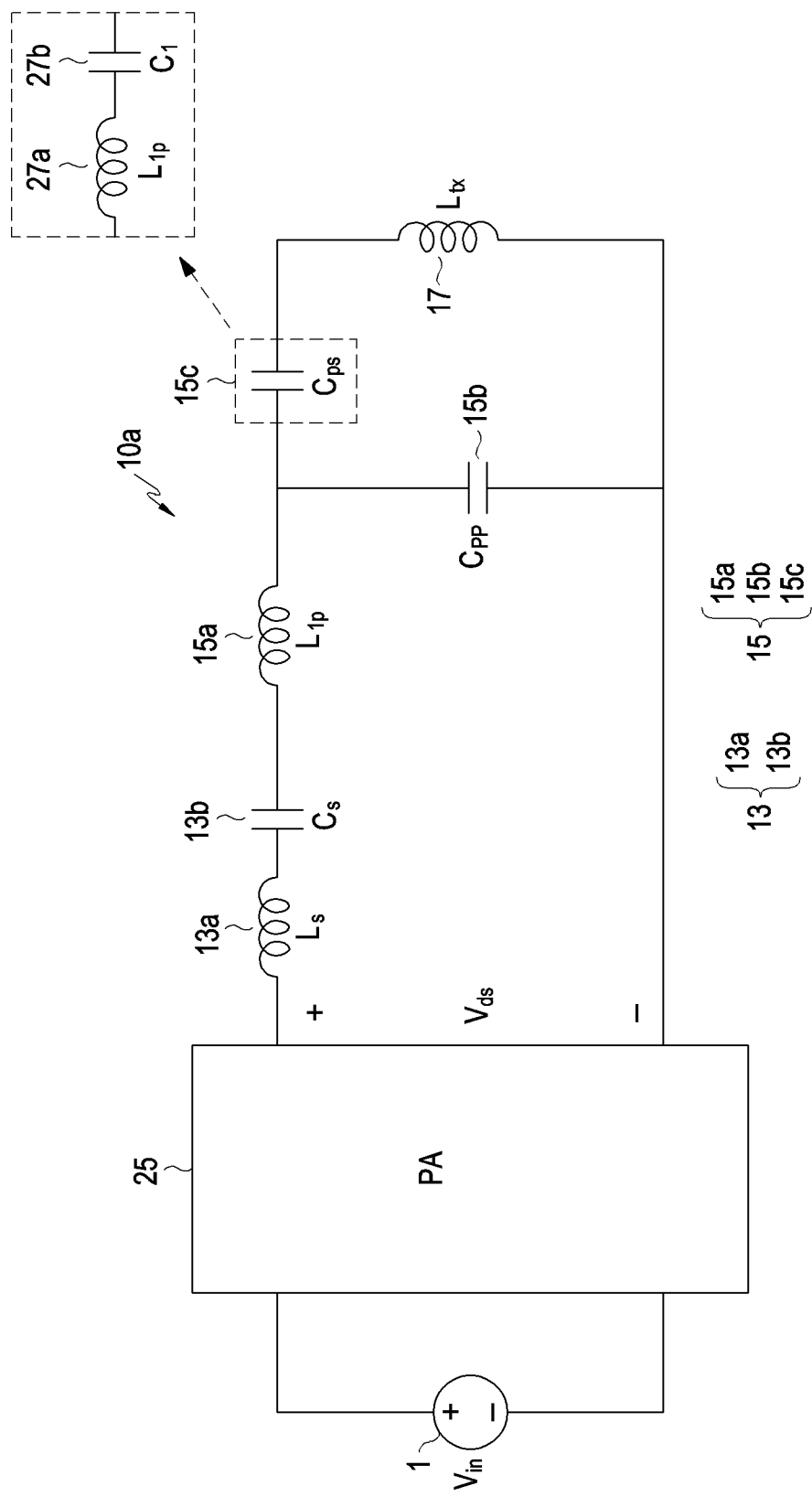
FIGS. 2A, 2B and 2C are diagrams for interpreting characteristics of the power transmission system of FIG. 1A.
Figure 2B:
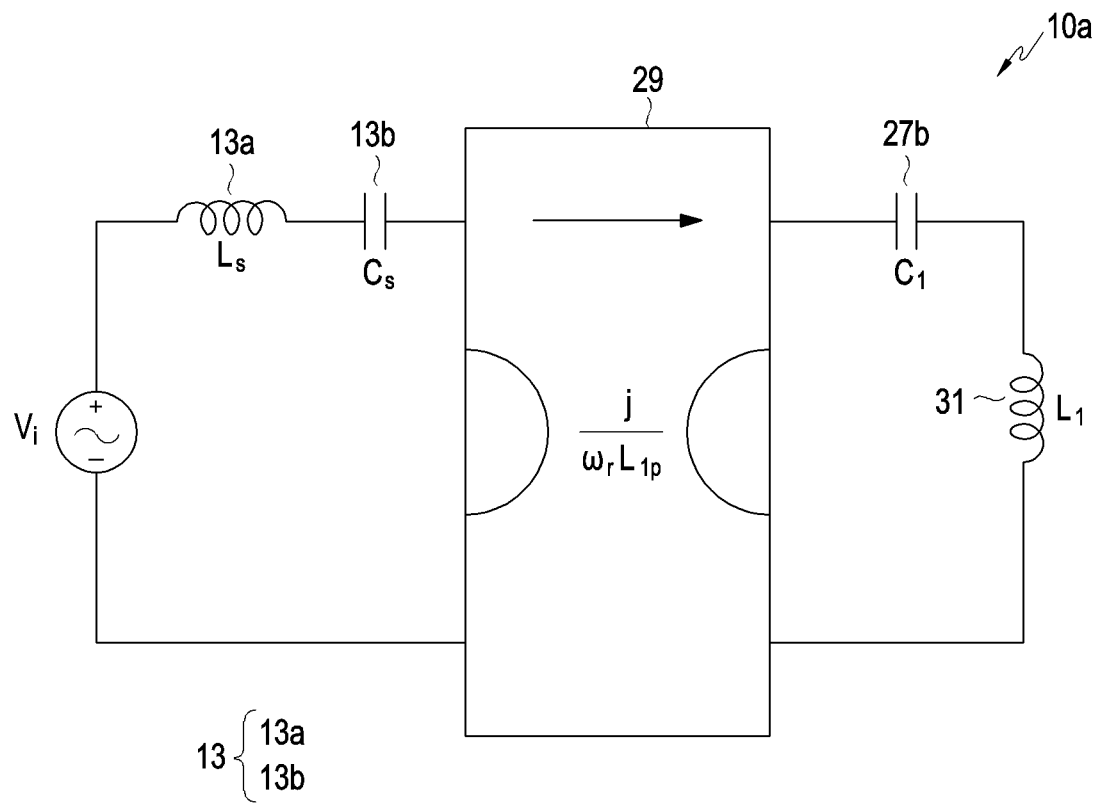
Figure 2C:
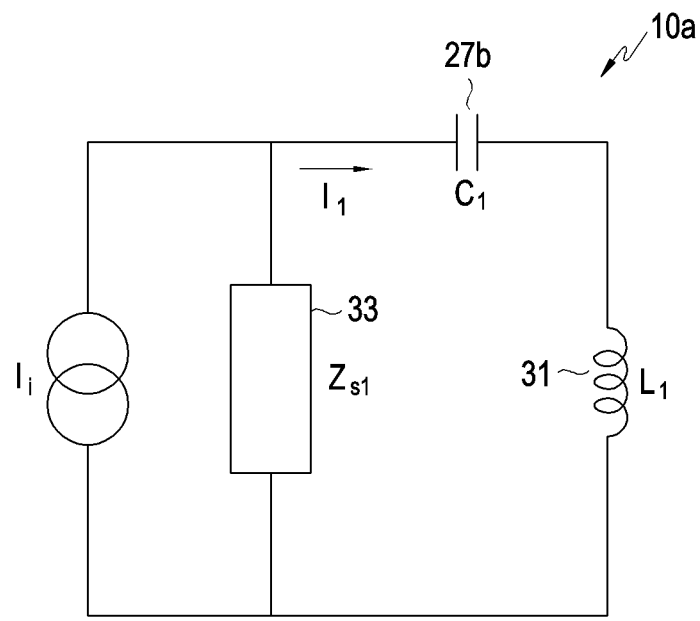

FIGS. 2A, 2B and 2C are diagrams for interpreting characteristics of the power transmission system 10a of FIG. 1A.

Referring to FIG. 2A, a PA block 25 is a single block in which the choke inductor 3, the driver 5, the transistor 7, the first capacitor 9, and the LC resonant circuit 11 of FIG. 1A are simplified.

The fifth capacitor $C_{ps}$ 15c may be interpreted as an inductor $L_{1p}$ 27a having an inductance value $L_{1p}$ having the same magnitude as that of the third inductor 15a at the resonant frequency $f_r$ of a resonator (e.g., the operating frequency $f_s$ of the input signal) and a capacitor $C_1$ 27b coupled in series to the inductor 27a (e.g., the impedance of the fifth capacitor 15c=the impedance of the inductor 27a+ the impedance of the capacitor 27b), and the capacitance value $C_{ps}$ of the fifth capacitor 15c, the inductance value $L_{1p}$ of the inductor 27a, and the capacitance value $C_1$ of the capacitor 27b may have a relationship as described in Equation 1.

$$-\frac{1}{j\omega_r C_{pz}} = j\omega_r L_{1p} - \frac{1}{j\omega_r C_1}, (\omega_r = 2\pi \cdot f_r) \quad \text{[Equation 1]}$$

The inductance value $L_{1p}$ of the third inductor $L_{1p}$ 15a and the capacitance value $C_{pp}$ of the fourth capacitor $C_{pp}$ 15b in the LCC network 15 may have a relationship as described in Equation 2.

$$\omega_r L_{1p} - \frac{1}{\omega_r C_{pp}} = 0, (\omega_r = 2\pi \cdot f_r) \quad \text{[Equation 2]}$$

Through Equation 1 and Equation 2, the relationship between the capacitance value $C_{ps}$ of the fifth capacitor 15c, the capacitance value $C_1$ of the capacitor 27b, and the capacitance value $C_{pp}$ of the fourth capacitor 15b may be given as Equation 3.

$$\frac{1}{j\omega_r C_{pz}} = \frac{1}{j\omega_r C_1} - \frac{1}{j\omega_r C_{pp}}, (\omega_r = 2\pi \cdot f_r) \quad \text{[Equation 3]}$$

Referring to FIG. 2A, since the third inductor 15a, the fourth capacitor 15b, and the inductor 27a have a T-shaped network connection, the third inductor 15a, the fourth capacitor 15b, and the inductor 27a may be interpreted as an equivalent gyrator 29 illustrated in FIG. 2B.

Referring to FIG. 2B, the third inductor 15a, the fourth capacitor 15b, and the inductor 27a of FIG. 2A may be interpreted as the gyrator 29 having a gyrator gain of $j/(\omega_r \cdot L_{1p})$. An inductor $L_1$ 31 is equivalent to the inductance of the transmission coil $L_{tx}$ 17 viewed from the capacitor $C_1$ to the right. For example, the inductance value of the inductor $L_1$ 31 may be equal to the inductance value of the transmission coil $L_{tx}$ 17, when there is no external metal (e.g., an external electronic device) around the power transmission system 10a. In the presence of an external metal (e.g., an external electronic device), the inductance value of the inductor $L_1$ 31 may be less than the inductance value of the transmission coil $L_{tx}$ 17 by as much as the influence of the external metal (e.g., the external electronic device). A voltage source $V_i$ is shown as an AC voltage source equivalent to a primary component (e.g., a fundamental component) of an output voltage $V_{ds}$ of the PA block 25 (e.g., the drain-source voltage of the transistor 7). The equivalent circuit diagram of the power transmission system 10a using the gyrator 29 illustrated in FIG. 2B may be interpreted as an equivalent circuit diagram including a current source $I_i$ and an equivalent impedance $Z_{s1}$ illustrated in FIG. 2C.

Referring to FIG. 2C, the voltage source $V_i$ may be interpreted as the current source $I_i$, the second LC resonant circuit 13 may be interpreted as the equivalent impedance $Z_{s1}$ 33, and the magnitudes of current output from the current source $I_i$ and the equivalent impedance $Z_{s1}$ 33 may be calculated using Equation 4 and Equation 5, respectively. In Equation 5, '$Z_s$' represents the impedance of the second LC resonant circuit 13, '$R_s$' represents the internal resistance of the second inductor 13a, and '$R_{1p}$' represents the internal resistance of the third inductor 15a. The internal resistance of the third capacitor 13b is omitted in Equation 5.

$$I_1 = \frac{jV_i}{\omega_r L_{1p}}, (\omega_r = 2\pi \cdot f_r) \quad \text{[Equation 4]}$$

$$Z_{s1} = \frac{(\omega_r L_{1p})^2}{Z_s} \approx \frac{(\omega_r L_{1p})^2}{R_s + R_{1p}}, (\omega_r = 2\pi \cdot f_r) \quad \text{[Equation 5]}$$

Current $I_1$ applied to the inductor $L_1$ 31 (e.g., applied to the transmission coil $L_{tx}$ 17) may be calculated by Equation 6.

$$I_1 = I_i \cdot \frac{Z_{s1}}{Z_{s1} + j\omega_r C_1 + \frac{1}{j\omega_r C_1}}, (\omega_r = 2\pi \cdot f_r) \quad \text{[Equation 6]}$$

Referring to Equation 6, when the resonant frequency of the capacitor $C_1$ 27b and the inductor $L_1$ 31 is the same as the operating frequency $f_s$ of the input signal, the current $I_1$ applied to the inductor $L_1$ 31 (e.g., applied to the transmission coil $L_{tx}$ 17) may be equal to the current output from the current source $I_i$.

Figure 3:
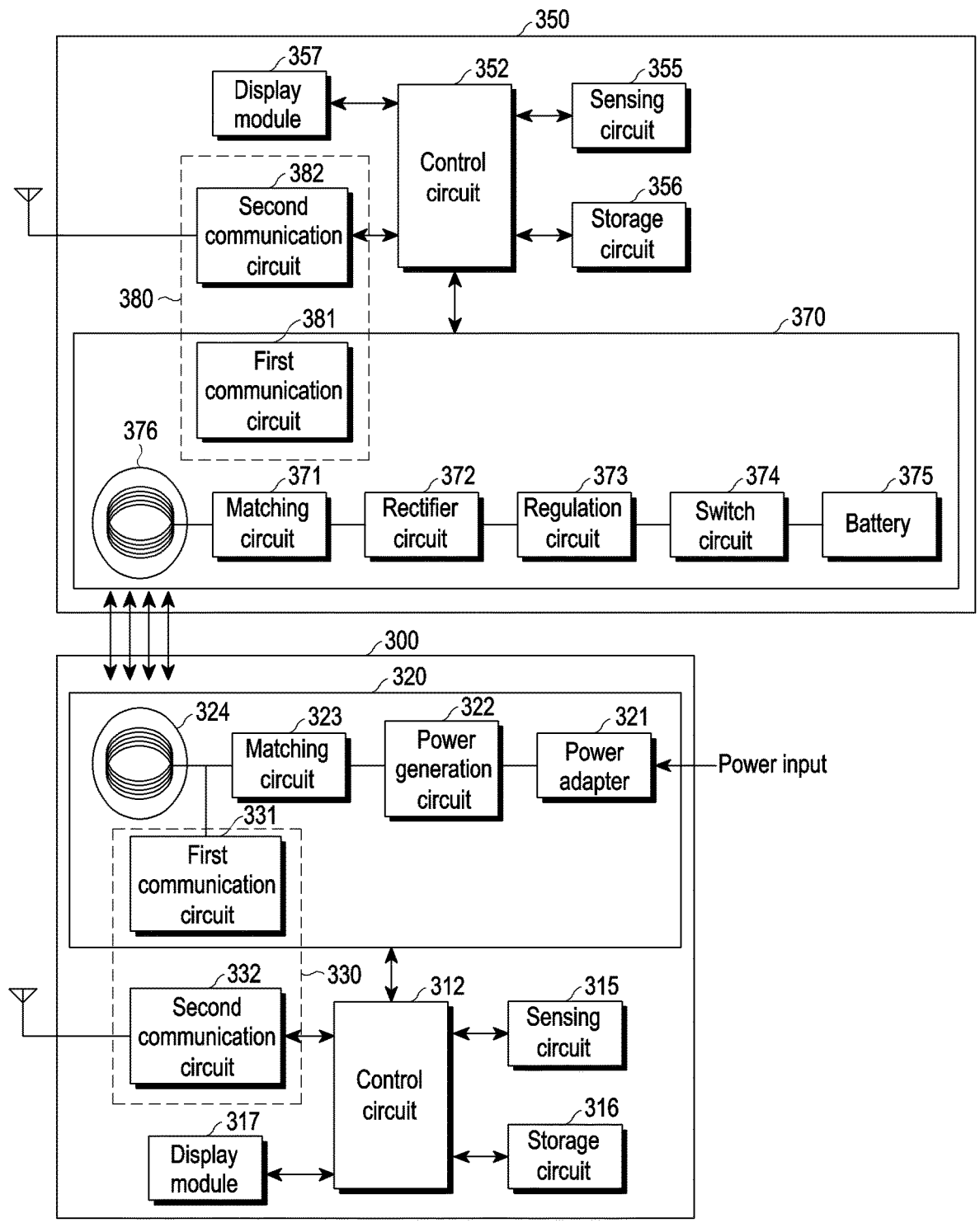
FIG. 3 is a block diagram illustrating an example wireless power transmitter and a wireless power receiver 350 according to various embodiments.

FIG. 3 is a block diagram illustrating an example wireless power transmitter 300 and an example wireless power receiver 350 according to various embodiments.

According to various embodiments, the wireless power transmitter 300 (e.g., a wireless power transmission device) may include a power transmission circuit 320, a control circuit 312, a communication circuit 330, a sensing circuit 315, and/or a storage circuit 316.

According to various embodiments, the wireless power transmitter 300 may supply power to the wireless power receiver 350 through the power transmission circuit 320. For example, the wireless power transmitter 300 may transmit power according to a resonance method. In the case of the resonance method, the wireless power transmitter 300 may be implemented in a manner defined in, for example, an Alliance for Wireless Power (A4WP) standard (or an air fuel alliance (AFA) standard). The wireless power transmitter 300 may include a conductive pattern 324 (e.g., a transmission coil) that may generate an induced magnetic field (e.g., a transmission (Tx) field) when current (e.g., AC) flows according to a resonance method or an induction method. A process of generating a magnetic field (e.g., the Tx field) through the conductive pattern 324 at the wireless power transmitter 300 may be expressed as outputting wireless power, and a process of generating an induced electromotive force based on the magnetic field (e.g., the Tx field) generated through the conductive pattern 324 at the wireless power receiver 350 may be expressed as receiving wireless power. Through this process, it may be said that the wireless power transmitter 300 wirelessly transmits power to the wireless power receiver 350. In addition, the wireless power receiver 350 may include a conductive pattern 376 (e.g., a transmission coil) that generates an induced electromotive force by a magnetic field (e.g., the Tx field) formed around the conductive pattern 376 and changing in magnitude over time. As the induced electromotive force is generated in the conductive pattern 376 of the wireless power receiver 350, AC current is output from the conductive pattern 376 or an AC voltage is applied to the conductive pattern 376. This process may be expressed as wireless power reception of the wireless power receiver 350. In another example, the wireless power transmitter 300 may transmit power according to an induction method. In the case of induction, the wireless power transmitter 300 may be implemented in a manner defined in, for example, a wireless power consortium (WPC) standard (or Qi standard).

According to various embodiments, the power transmission circuit 320 may include a power adapter 321, a power generation circuit 322, a matching circuit 323, a conductive pattern (e.g., a transmission coil) 324, or a first communication circuit 331. According to various embodiments, the power transmission circuit 320 may be configured to wirelessly transmit power to the wireless power receiver 350 through the conductive pattern 324. According to various embodiments, the power transmission circuit 320 may receive power in the form of a DC or AC waveform from the outside, and supply the received power in the form of the AC waveform to the wireless power receiver 350.

According to various embodiments, the power adapter 321 may receive AC or DC power from the outside or a power signal of a battery device, and output DC power having a set voltage value. According to various embodiments, the voltage value of the DC power output from the power adapter 321 may be controlled by the control circuit 312. According to various embodiments, the DC power output from the power adapter 321 may be output to the power generation circuit 322.

According to various embodiments, the power generation circuit 322 may convert DC current output from the power adapter 321 into AC current and output the AC current. According to various embodiments, the power generation circuit 322 may include a predetermined amplifier (not shown). According to various embodiments, when the DC current received through the power adapter 321 is less than a set gain, the power generation circuit 322 may use the amplifier (not shown) to amplify the DC current to the set gain. Alternatively, the power generation circuit 322 may include a circuit that converts the DC current received from the power adapter 321 into AC current based on a control signal received from the control circuit 312. For example, the power generation circuit 322 may convert the DC current received from the power adapter 321 into the AC current through a predetermined inverter (not shown). Alternatively, the power generation circuit 322 may include a gate driving device (not shown). The gate driving device (not shown) may convert the DC current received from the power adapter 321 into the AC current by controlling on/off the DC current. Alternatively, the power generation circuit 322 may generate an AC power signal through a wireless power generator (e.g., an oscillator).

According to various embodiments, the matching circuit 323 may perform impedance matching. For example, when the AC current (e.g., an AC signal) output from the power generation circuit 322 is transmitted to the conductive pattern 324, an electromagnetic field may be formed in the conductive pattern 324 by the AC signal. The frequency band of the formed electromagnetic field (e.g., an electromagnetic field signal) may be adjusted by adjusting the impedance of the matching circuit 323. According to various embodiments, the matching circuit 323 may control output power to be transmitted to the wireless power receiver 350 through the conductive pattern 324 to have high efficiency or high output by the impedance adjustment. According to various embodiments, the matching circuit 323 may adjust the impedance based on the control of the control circuit 312. The matching circuit 323 may include at least one of an inductor (e.g., a coil), a capacitor, or a switch device. The control circuit 312 may control a connection state with at least one of the inductor or the capacitor through the switch device, and thus perform impedance matching.

According to various embodiments, the first communication circuit 331 (e.g., a resonant circuit) may perform communication (e.g., data communication) with a communication circuit 380 (e.g., the first communication circuit 381) of the wireless power transmitter 350 in an in-band manner, using electromagnetic waves generated from the conductive pattern 324.

According to various embodiments, the sensing circuit 315 may sense a change in current/voltage applied to the conductive pattern 324 of the power transmission circuit 320. The amount of power to be transmitted to the wireless power receiver 350 may vary according to the change in the current/voltage applied to the conductive pattern 324. Alternatively, the sensing circuit 315 may sense a temperature change of the wireless power transmitter 300. According to various embodiments, the sensing circuit 315 may include at least one of a current/voltage sensor or a temperature sensor.

According to various embodiments, the control circuit 312 may control the operation of the wireless power transmitter 300. For example, the control circuit 312 may control the operation of the wireless power transmitter 300 using an algorithm, program, or application required for control, stored in the storage circuit 316. The control circuit 312 may be implemented in a form such as a central processing unit (CPU), a microprocessor, or a mini-computer. For example, the control circuit 312 may display the state of the wireless power receiver 350 on a display module 317 including a display based on a message received from the wireless power receiver 350 through the communication circuit 330.

According to various embodiments, the control circuit 312 may control to wirelessly transmit power to the wireless power receiver 350 through the power transmission circuit 320. According to various embodiments, the control circuit 312 may control to wirelessly receive information from the wireless power receiver 350 through the communication circuit 330.

According to an embodiment, the information received from the wireless power receiver 350 may include at least one of charging setting information related to a battery state of the wireless power receiver 350, power amount control information related to adjustment of the amount of power transmitted to the wireless power receiver 350, environment information related to a charging environment of the wireless power receiver 350, or time information about the wireless power receiver 350. According to an embodiment, the charging setting information may be information related to the battery state of the wireless power receiver 350 at a time of wireless charging between the wireless power transmitter 300 and the wireless power receiver 350. For example, the charging setting information may include at least one of a total battery capacity, a remaining battery amount, the number of charging times, a battery usage, a charging mode, a charging method, or a wireless reception frequency band of the wireless power receiver 350. According to an embodiment, the power amount control information may include information for controlling the amount of initial power transmitted according to a change in the amount of power charged in the wireless power receiver 350 during wireless charging between the wireless power transmitter 300 and the wireless power receiver 350. According to an embodiment, the environment information, which is information obtained by measuring the charging environment of the wireless power receiver 350 by the sensing circuit 355 of the wireless power receiver 350, may include at least one of, for example, temperature data including at least one of an internal temperature or an external temperature of the wireless power receiver 350, illuminance data indicating an illuminance (brightness) around the wireless power receiver 350, or sound data indicating sound (noise) around the wireless power receiver 350. According to an embodiment, the control circuit 312 may control to generate power to be transmitted to the wireless power receiver 350 or transmit the power to the wireless power receiver 350, based on the charging setting information in the information received from the wireless power receiver 350. Alternatively, the control circuit 312 may determine or change the amount of power to be transmitted to the wireless power receiver 350, based on at least in part (e.g., at least one of the power amount control information, the environment information, or the time information) of the information received from the wireless power receiver 350. Alternatively, the control circuit 312 may control the matching circuit 323 to change an impedance.

According to various embodiments, the display module 317 may display overall information related to the state of the wireless power transmitter 300, the environmental information, or the charging state.

According to various embodiments, the communication circuit 330 may communicate with the wireless power receiver 350 in a predetermined method. The communication circuit 330 may perform data communication with the communication circuit 380 of the wireless power receiver 350. For example, the communication circuit 330 may unicast, multicast, or broadcast a signal.

According to an embodiment, the communication circuit 330 may include at least one of the first communication circuit 331 implemented in one hardware unit together with the power transmission circuit 320 so that the wireless power transmitter 300 may communicate in an in-band manner, or a second communication circuit 332 implemented in a different hardware unit from the first communication circuit 331 or the power transmission circuit 320 so that the wireless power transmitter 300 may communicate in an out-of-band manner.

According to an embodiment, when the communication circuit 330 includes the first communication circuit 331 capable of performing communication in the in-band manner, the first communication circuit 331 may receive the frequency and signal level of an electromagnetic field signal received through the conductive pattern 324 of the power transmission circuit 320. The control circuit 312 may extract information received from the wireless power receiver 350 by decoding the frequency and signal level of the electromagnetic field signal received through the conductive pattern 324. Alternatively, the first communication circuit 331 may transmit information of the wireless power transmitter 300 to the wireless power receiver 350 by loading a signal of the information of the wireless power transmitter 300 to be transmitted to the wireless power receiver 350 on the conductive pattern 324 (e.g., by changing the impedance of the conductive pattern 324) according to an applied (e.g., on/off keying) modulation scheme or adding a signal for the information of the wireless power transmitter 300 to an electromagnetic signal generated as a signal output from the matching circuit 323 is applied to the conductive pattern 324. The control circuit 312 may control to output the information of the wireless power transmitter 300 by changing a connection state with at least one of the inductor or the capacitor of the matching circuit 323 through control of on/off of the switch device included in the matching circuit 323.

According to an embodiment, when the communication circuit 330 includes the second communication circuit 332 capable of performing communication in the out-of-band manner, the second communication circuit 332 may communicate with the communication circuit 380 (e.g., a second communication circuit 382) of the wireless power receiver 350 by near field (NFC) communication, Zigbee communication, infrared (IR) communication, visible light communication, Bluetooth communication, Bluetooth low energy (BLE) communication, or ultra-wideband (UWB) communication.

The above-described communication methods of the communication circuit 330 are merely by way of example, and the scope of the disclosure is not limited to a specific communication method performed by the communication circuit 330.

According to various embodiments, the wireless power receiver 350 (e.g., a wireless power reception device) may include a power reception circuit 370, a control circuit 352, the communication circuit 380, a sensing circuit 355, a storage circuit 356, and/or a display module 357.

According to various embodiments, the power reception circuit 370 may receive power from the power transmission circuit 320 of the wireless power transmitter 300. The power reception circuit 370 may be implemented in the form of a built-in battery or may be implemented in the form of a power reception interface to receive power from the outside (e.g., external power). The power reception circuit 370 may include a matching circuit 371, a rectifier circuit 372, a regulation circuit 373, a switch circuit 374, a battery 375, and/or the conductive pattern 376.

According to various embodiments, the power reception circuit 370 may generate wireless power in the form of electromagnetic waves generated in correspondence with the current/voltage applied to the conductive pattern 324 of the power transmission circuit 320, through the conductive pattern 376. For example, the power reception circuit 370 may receive power using induced electromotive forces formed in the conductive pattern 324 of the power transmission circuit 320 and the conductive pattern 376 of the power reception circuit 370.

According to various embodiments, the matching circuit 371 may perform impedance matching. For example, power transmitted through the conductive pattern 324 of the wireless power transmitter 300 may be transmitted to the conductive pattern 376 to form an electromagnetic field. According to various embodiments, the matching circuit 371 may adjust the frequency band of the formed electromagnetic field (e.g., an electromagnetic field signal) by impedance adjustment. According to various embodiments, the matching circuit 371 may control input power received from the wireless power transmitter 300 through the conductive pattern 376 to have high efficiency and high output by the impedance adjustment. According to various embodiments, the matching circuit 371 may adjust an impedance based on the control of the control circuit 352. The matching circuit 371 may include at least one of an inductor (e.g., a coil), a capacitor, or a switch device. The control circuit 352 may control a connection state with at least one of the inductor or the capacitor through the switch device, and thus may perform impedance matching.

According to various embodiments, the rectifier circuit 372 may rectify the wireless power received by the conductive pattern 376 in a DC form, and may be implemented in the form of, for example, a bridge diode.

According to various embodiments, the regulation circuit 373 may convert the rectified power to a set gain. The regulation circuit 373 may include a DC/DC converter (not shown). For example, the regulation circuit 373 may convert the rectified power so that the voltage of an output terminal becomes 5V. Alternatively, a minimum value or a maximum value of a voltage applicable to the front end of the regulation circuit 373 may be set.

According to various embodiments, a switch circuit 374 may couple the regulation circuit 373 to the battery 375. According to various embodiments, the switch circuit 374 may maintain an on/off state under the control of the control circuit 352.

According to various embodiments, the battery 375 may be charged by receiving power from the regulation circuit 373.

According to various embodiments, the sensing circuit 355 may sense a change in the state of power received at the wireless power receiver 350. For example, the sensing circuit 355 may periodically or aperiodically measure a current/voltage value received by the conductive pattern 376 through a predetermined current/voltage sensor (not shown). According to various embodiments, the wireless power receiver 350 may calculate the amount of power received at the wireless power receiver 350 based on the current/voltage measured through the predetermined current/voltage sensor (not shown). According to various embodiments, the sensing circuit 355 may sense a change in the charging environment of the wireless power receiver 350. For example, the sensing circuit 355 may periodically or aperiodically measure at least one of an internal temperature or an external temperature of the wireless power receiver 350 through a predetermined temperature sensor (not shown).

According to various embodiments, the display module 357 may display overall information related to the charging state of the wireless power receiver 350. For example, the display module 357 may display at least one of the total battery capacity of the wireless power receiver 350, a remaining battery amount, a battery charge amount, a battery usage, or an expected charging time.

According to various embodiments, the communication circuit 380 may communicate with the wireless power transmitter 300 in a predetermined method. The communication circuit 380 may perform data communication with the communication circuit 330 of the wireless power transmitter 300. According to various embodiments, the communication circuit 380 may operate in the same manner as or in a similar manner to the communication circuit 330 of the wireless power transmitter 300.

According to various embodiments, the control circuit 352 may transmit charging setting information for receiving a required power amount based on information related to the battery state of the wireless power receiver 350 to the wireless power transmitter 300 through the communication circuit 380. For example, when the control circuit 352 identifies the wireless power transmitter 300 capable of transmitting wireless power, the control circuit 352 may transmit charging setting information for receiving a required power amount based on at least one of the total battery capacity of the wireless power receiver 350, a remaining battery amount, the number of charging times, a battery usage, a charging mode, a charging method, or a wireless reception frequency band to the wireless power transmitter 300 through the communication circuit 380.

According to various embodiments, the control circuit 352 may transmit power amount control information for controlling the amount of power received from the wireless power transmitter 300 according to a change in the amount of power charged in the wireless power receiver 350 to the wireless power transmitter 300 through the communication circuit 380.

According to various embodiments, the control circuit 352 may transmit environment information according to a change in the charging environment of the wireless power receiver 350 to the wireless power transmitter 300 through the communication circuit 380. For example, when a temperature data value measured by the sensing circuit 355 is equal to or greater than a set temperature threshold, the control circuit 352 may transmit the measured temperature data to the wireless power transmitter 300.

Although the wireless power transmitter 300 and the wireless power receiver 350 are shown in FIG. 3 as including only the power transmission circuit 320 and the power reception circuit 370, respectively, each of the wireless power transmitter 300 and the wireless power receiver 350 may include both the power transmission circuit 320 and the power reception circuit 370. Accordingly, the wireless power transmitter 300 and the wireless power receiver 350 according to various embodiments may perform the functions of both a power transmitter and a power receiver.

Figure 4:
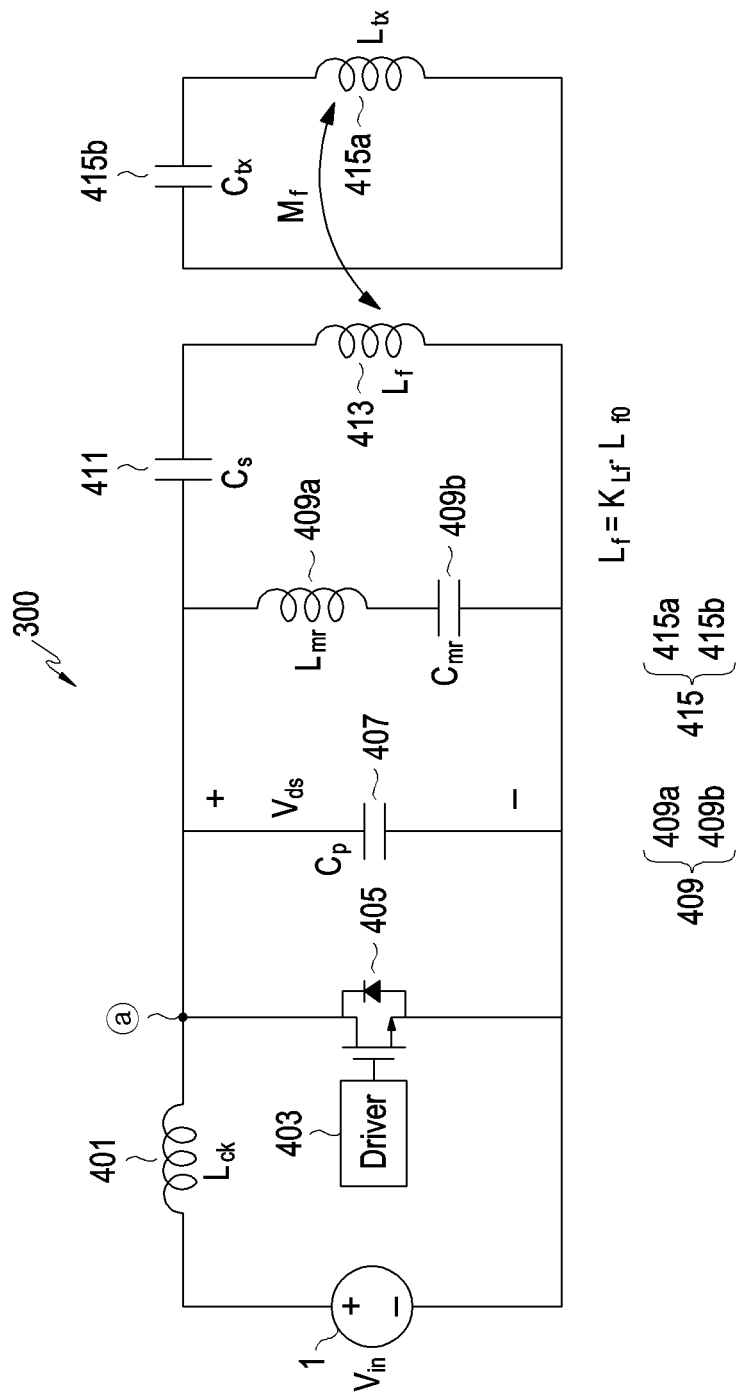
FIG. 4 is a diagram illustrating components of an example wireless power transmitter according to various embodiments of the disclosure.

FIG. 4 is a diagram illustrating components of the example wireless power transmitter 300 according to various embodiments of the disclosure.

According to various embodiments, the wireless power transmitter 300 may include the input power supply 1 (e.g., the power adapter 321 of FIG. 3), a choke inductor $L_{ck}$ 401, a driver 403, and a transistor 405 (e.g., the power generation circuit 322 of FIG. 3), a first capacitor $C_p$ 407, a first LC resonant circuit 409, a third capacitor $C_s$ 411, a feeding coil $L_f$ 413, and/or a transmission resonator 415. The illustrated '$V_{ds}$' represents an output voltage (e.g., a drain-source voltage) of the transistor 405.

According to various embodiments, the choke inductor 401, the driver 403, the transistor 405, the first capacitor 407, and the first LC resonant circuit 409 may be described in the same manner as the choke inductor 3, the driver 5, the transistor 7, the first capacitor 9, and the first LC resonant circuit 11 described above with reference to FIG. 1A.

According to various embodiments, the first capacitor 407 may be coupled in parallel to the transistor 7. According to various embodiments, the capacitance value $C_p$ of the first capacitor 407 and the inductance value $L_{ck}$ of the choke inductor 401 may be set to have a preset ratio based on the operating frequency $f_s$ of an input signal. The relationship between the capacitance value $C_p$ and the inductance value $L_{ck}$ may be given as Equation 7. In Equation 7, $k_c$ may be set to, but not limited to, a value in the range of 1 to 2 (e.g., 2). For example, the $L_{ck}$ value may be set to 180 nH.

$$C_p = \frac{1}{k_c \omega_r^2 L_{ck}}, (\omega_r = 2\pi \cdot f_r \,\&\, f_r = f_s) \qquad \text{[Equation 7]}$$

According to various embodiments, the first LC resonant circuit 409 may be coupled in parallel to the transistor 7. According to various embodiments, the first LC resonant circuit 409 may include a first inductor $L_{mr}$ 409a and a second capacitor $C_{mr}$ 409b. According to various embodiments, the first inductor 409a and the second capacitor 409b may be coupled to each other in series. According to various embodiments, the capacitance value $C_{mr}$ of the second capacitor 409b and the inductance value $L_{mr}$ of the first inductor 409a are set to have a preset ratio based on the operating frequency $f_s$ of the input signal, and the relationship between the capacitance value $C_{mr}$ and the inductance value $L_{mr}$ may be given as Equation 8. According to an embodiment, various multiple values of $\omega_r$ such as $\omega_r$ may be used instead of '$2\omega_r$' in Equation 8. For example, the $L_{mr}$ value may be set to 180 nH.

$$C_{mr} = \frac{1}{(2\omega_r)^2 L_{mr}}, (\omega_r = 2\pi \cdot f_r \,\&\, f_r = f_s) \qquad \text{[Equation 8]}$$

According to various embodiments, one end of the third capacitor $C_s$ 411 may be coupled to the output terminal ⓐ of the transistor 7 and the first LC resonant circuit 409. For example, the third capacitor 411 may be coupled to the first inductor 409a of the first LC resonant circuit 409 as illustrated. However, depending on the arrangement positions of the first inductor 409a and the second capacitor 409b, the third capacitor 411 may be coupled to the second capacitor 409b.

According to various embodiments, the feeding coil $L_f$ 413 may be coupled to the third capacitor 411 in series. For example, the feeding coil 413 may be coupled to the other end of the third capacitor 411. According to various embodiments, at least a part of the feeding coil 413 may be used to form the second LC resonant circuit with the third capacitor 411. For example, a part (hereinafter, referred to as a first part) of the feeding coil 413 may be used to configure the third capacitor 411 and the second LC resonant circuit. In this case, the resonant frequency $f_r$ of the second LC resonant circuit may correspond to the operating frequency $f_s$ of the input signal. The remaining part (hereinafter, referred to as a second part) of the feeding coil 413 may be used such that the equivalent impedances of the feeding coil 413 and the third capacitor 411 have an inductive characteristic. More specifically, the inductance value $L_f$ of the feeding coil 413 may be described as the sum of the inductance value of the first part (hereinafter, referred to a first inductance value $L_{f0}$) and the inductance value of the second part (hereinafter, a second inductance value).

According to various embodiments, the first part of the feeding coil 413 may be configured to have the first inductance value $L_{f0}$ such that the impedance of the second LC resonant circuit becomes zero at the operating frequency $f_s$ (e.g., the resonant frequency $f_r$ of the second LC resonant circuit matches the operating frequency $f_s$), and the relationship between the first inductance value $L_{f0}$ and the capacitance value $C_s$ of the third capacitor 411 may be expressed as Equation 9.

$$j\omega_r L_{f0} + \frac{1}{j\omega_r C_s} = 0, (\omega_r = 2\pi \cdot f_r \,\&\, f_r = f_s) \qquad \text{[Equation 9]}$$

According to an embodiment, the entire feeding coil 413 may be used to form the second LC resonant circuit with the third capacitor 411. In this case, the feeding coil 413 may be configured to have the inductance value $L_f$ such that the impedance of the second LC resonant circuit becomes zero at the operating frequency $f_s$.

According to various embodiments, the first inductance value $L_{f0}$ and the inductance value $L_f$ of the feeding coil 413 may be placed in the relationship described in Equation 10.

$$L_f = K_{Lf} L_{f0} \qquad \text{[Equation 10]}$$

Referring to Equation 10, '$L_{f0}$' represents the first inductance value of the first part of the feeding coil 413. A proportionality constant $K_{Lf}$ may represent the ratio of the total inductance value (e.g., the sum of the first inductance value $L_{f0}$ of the first part and the second inductance value of the second part) of the feeding coil 413 to the first inductance value $L_{f0}$.

For example, when the proportionality constant $K_{Lf}$ is greater than 1 (e.g., when the part (e.g., the first part) of the feeding coil 413 forms the second LC resonant circuit), the second inductance value of the feeding coil 413 may be described as $L_f - L_{f0} (= (K_{Lf} - 1) \cdot L_{f0})$.

In another example, when the proportionality constant $K_{Lf}$ is 1 (e.g., when the entire feeding coil 413 forms the second LC resonant circuit), the inductance value $L_f$ of the feeding coil 413 may be described as equal to the first inductance value $L_{f0}$.

According to various embodiments, the second LC resonant circuit including at least a part of the feeding coil 413 and the third capacitor 411 may operate as a band-pass filter (or a first filter) at the operating frequency $f_s$ of the input signal. For example, the resonant frequency $f_r$ of the second LC resonant circuit may be set to correspond to the operating frequency $f_s$.

According to various embodiments, when the first part of the feeding coil 413 forms the second LC resonant circuit with the third capacitor 411, the second inductance value of the second part of the feeding coil 413 may be determined based on the inductance value of the coil $L_{tx}$ 415a and/or a magnetic coupling coefficient (e.g., a magnetic coupling coefficient $k_f$ to be described later) between the transmission coil 415a and the feeding coil 413, which will be described in more detail with reference to the drawings to be described later.

According to various embodiments, the first capacitor 407 may be described as a component included in the power generation circuit 322 of FIG. 3. According to various embodiments, at least one of the first LC resonant circuit 409, the third capacitor 411, or the feeding coil 413 may be described as a component included in the matching circuit 323 of FIG. 3. According to an embodiment, the first capacitor 407 may be described as a component included in the matching circuit 323.

According to various embodiments, the transmission resonator 415 may include a transmission coil $L_{tx}$ 415a (e.g., the conductive pattern 324 of FIG. 3) and a fourth capacitor $C_{tx}$ 415b. According to various embodiments, the inductance value $L_{tx}$ of the transmission coil 415a and the capacitance value $C_{tx}$ of the fourth capacitor 415b may be placed in the relationship described in Equation 11.

$$C_{tx} = \frac{1}{(\omega_r)^2 L_{tx}} = 0, (\omega_r = 2\pi \cdot f_r \,\&\, f_r = f_s) \qquad \text{[Equation 11]}$$

According to various embodiments, at least a part of the transmission coil 415a may be magnetically coupled to the feeding coil 413. The illustrated '$M_f$' represents a mutual inductance between the transmission coil 415a and the feeding coil 413. According to various embodiments, based on an induced magnetic field generated from the feeding coil 413, an induced electromotive force may be generated at the transmission coil 415a to output AC current from the transmission coil 415a. Therefore, wireless power may be transmitted from the feeding coil 413 to the transmission resonator 415. According to various embodiments, the transmission resonator 415 may form an externally induced magnetic field based on the wireless power received from the feeding coil 413. Accordingly, at least a part of the power transmitted from the feeding coil 413 may be output to the outside through the transmission resonator 415.

According to various embodiments, the first LC resonant circuit 409 and the third capacitor 411 may be disposed on the same printed circuit board (PCB). According to various embodiments, the feeding coil 413 and the transmission resonator 415 may be disposed outside the PCB. Due to this arrangement structure, an EMI shield may be disposed between the third capacitor 411 and the feeding coil 413, and EMI generated from at least one of the third capacitor 411 and the components shown on the left side of the third capacitor 411 may be prevented from affecting the feeding coil 413 and/or the transmission resonator 415.

Figure 5A:
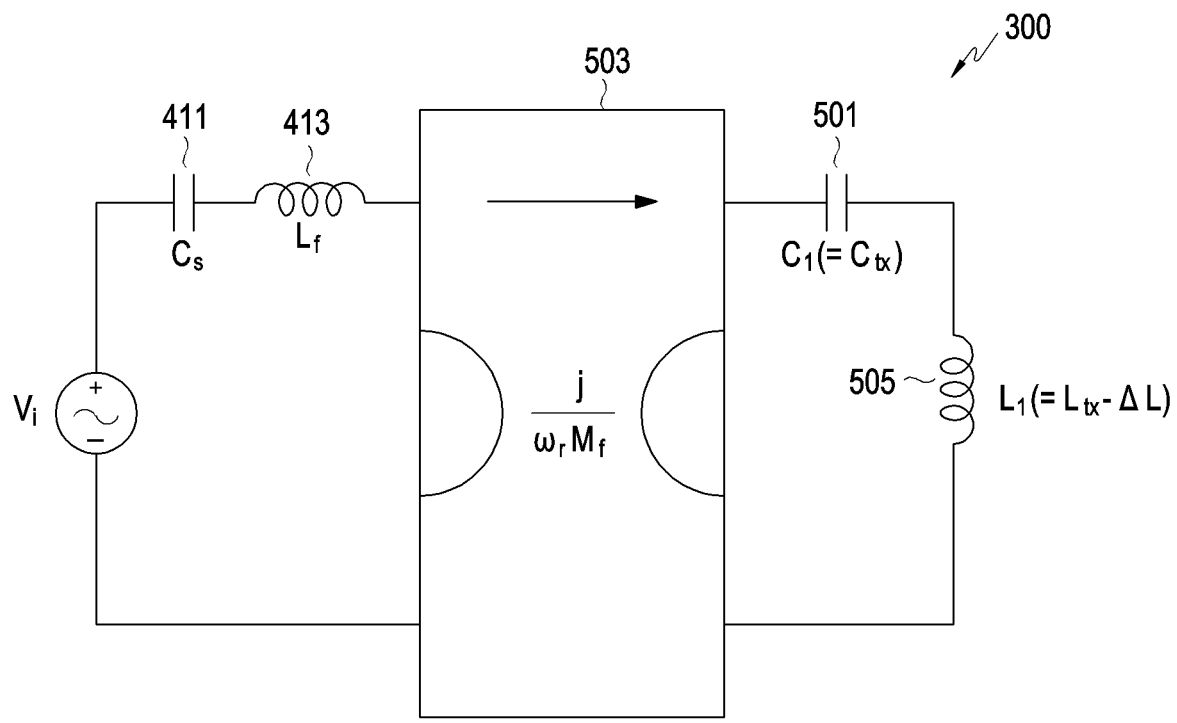
FIGS. 5A and 5B are diagrams for interpreting characteristics of the example wireless power transmitter of FIG. 4.
Figure 5B:
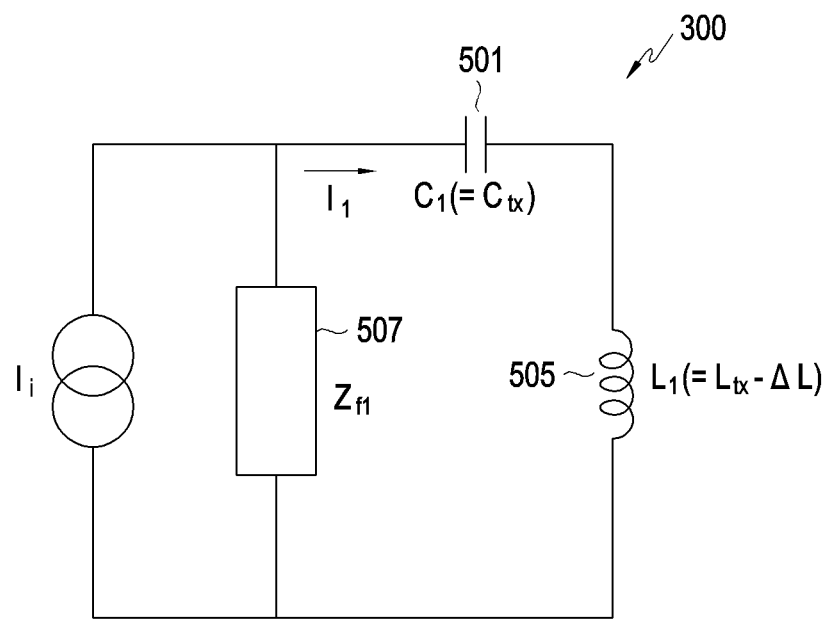

FIGS. 5A and 5B are diagrams for interpreting characteristics of the example wireless power transmitter 300 of FIG. 4.

Referring to FIG. 5A, the magnetic coupling (e.g., the mutual inductance $M_f$) between the feeding coil 412 and the transmission coil 415a of FIG. 4 may be interpreted as a gyrator 503 having a gyrator gain of $j/(\omega_r \cdot M_f)$. According to various embodiments, a capacitor $C_1$ 501 may have a capacitance value equal to that of the fourth capacitor $C_{tx}$ 415b of FIG. 4. According to various embodiments, an inductor $L_1$ 505 is equivalent to the inductance of the transmission coil $L_{tx}$ 415a viewed from the capacitor $C_1$ (e.g., the fourth capacitor $C_{tx}$) to the right. For example, the inductance value of the inductor $L_1$ 505 may be equal to the inductance value $L_{tx}$ of the transmission coil $L_{tx}$ 415a, when there is no external metal (e.g., an external electronic device) around the power transmission system 300. In the presence of an external metal (e.g., an external electronic device), the inductance value of the inductor $L_1$ 505 may be less than the inductance value of the transmission coil $L_{tx}$ 415a by as much as the influence (e.g., $\Delta L$) of the external metal (e.g., the wireless power receiver 350). For example, the inductance value of the inductor L$_1$ 505 may be expressed as Equation 12.

$$L_1 = L_{tx} - \Delta L \quad \text{[Equation 12]}$$

According to various embodiments, the influence ΔL of the external electronic device (e.g., the wireless power receiver 350) disposed outside the wireless power transmitter 300 may be changed based on the distance between the wireless power transmitter 300 and the wireless power receiver 350.

The illustrated voltage source V$_i$ is an AC voltage source shown as equivalent to the primary component (e.g., fundamental component) of an output voltage V$_{ds}$ (e.g., the drain-source voltage of transistor 405) of a PA (e.g., the transistor 405). The equivalent circuit diagram of the wireless power transmitter 300 using the gyrator 503 illustrated in FIG. 5A may be interpreted as an equivalent circuit diagram including a current source I$_i$ and an equivalent impedance Z$_{f1}$, illustrated in FIG. 5B.

Referring to FIG. 5B, the voltage source V$_i$ may be interpreted as the current source I$_i$, the second LC resonant circuit 409 may be interpreted as an equivalent impedance Z$_{s1}$ 507, and the magnitudes of current output from the current source I$_i$ and the equivalent impedance Z$_{s1}$ 507 may be calculated using Equation 13 and Equation 14, respectively. In Equation 13, 'k$_f$' represents the magnetic coupling coefficient between the transmission coil 415a and the feeding coil 413. In Equation 14, 'Z$_f$' represents the equivalent impedance of the third capacitor 411 and the feeding coil 413, and 'R$_f$' represents the internal resistance of the feeding coil 413. In Equation 13 and Equation 14, K$_{Lf}$ represents the proportional constant K$_{Lf}$ of Equation 10.

$$I_i = \frac{jV_i}{\omega_r M_f} = \frac{jV_i}{\omega_r k_f \sqrt{L_1(K_{Lf}L_f)}}, \quad \text{[Equation 13]}$$

$$(\omega_r = 2\pi \cdot f_r \,\&\, M_f = k_f\sqrt{L_1(K_{Lf}L_f)})$$

$$Z_{f1} = \frac{(\omega_r M_f)^2}{Z_f} \approx \frac{(\omega_r M_f)^2}{j\omega_r(K_{Lf}-1)L_f + R_f}, \, (\omega_r = 2\pi \cdot f_r) \quad \text{[Equation 14]}$$

Current I$_1$ applied to the inductor L$_1$ 505 (e.g., applied to the transmission coil 415a) may be calculated by Equation 15.

$$I_1 = I_i \cdot \frac{Z_{f1}}{Z_{f1} + j\omega_r L_1 + \frac{1}{j\omega_r C_1}}, \, (\omega_r = 2\pi \cdot f_r) \quad \text{[Equation 15]}$$

Referring to Equation 9 and Equation 10 together, the inductance value L$_f$ of the feeding coil 413 may be set to K$_{Lf}$·L$_{f0}$(K$_{Lf}$>1) greater than the first inductance value L$_{f0}$ for configuring the third capacitor 411 and the second LC resonant circuit. Because the inductance value L$_f$ of the feeding coil 413 is set to a value greater than the first inductance value L$_{f0}$, the phenomenon may be prevented, that as the distance between the wireless power transmitter 300 and the external electronic device (e.g., the wireless power receiver 350) decreases, power output from the transistor 405 and/or power transmitted to (or received from) the electronic device (e.g., the wireless power receiver 350) rapidly increases. More specifically, referring to Equation 12, when the distance between the wireless power transmitter 300 and the external electronic device (e.g., the wireless power receiver 350) decreases, the inductance value L$_1$ viewed from the transmission coil L$_{tx}$ 17 may decrease by ΔL due to the influence of the metal of the external electronic device (e.g., the wireless power receiver 350). Therefore, while the impedance Z$_1$ (Z$_1$=jω$_r$L$_1$+1/(jω$_r$C$_1$)) of the transmission resonator 415 increases, the current I$_1$ applied to the resonator 415 (e.g., applied to the transmission coil 415a) decreases, and the phenomenon of the rapid increase of power transmitted to the external electronic device (e.g., the wireless power receiver 350) may be prevented.

According to various embodiments, the inductance value L$_f$ of the feeding coil 413 (or the second inductance value of the second part of the feeding coil 413) may be determined based on the inductance value of the transmission coil L$_{tx}$ 415a, and/or the magnetic coupling coefficient k$_f$ between the transmission coil 415a and the feeding coil 413.

For example, the impedance Z$_1$ of the resonator 415 in which the current I$_1$ applied to the resonator 415 (e.g., applied to the transmission coil 415a) is reduced to ½ may be defined as Z$_{3dB}$ in Equation 16.

$$Z_{3dB} = \frac{(\omega_r M_f)^2}{Z_f} \approx \frac{(\omega_r M_f)^2}{j\omega_r(K_{Lf}-1)L_f + R_f} \approx \frac{\omega_r k_f^2 K_{Lf} L_1}{j(K_{Lf}-1)}, \quad \text{[Equation 16]}$$

$$(\omega_r = 2\pi \cdot f_r)$$

Because the impedance Z$_1$ of the resonator 415 varies according to the distance between the wireless power transmitter 300 and the external electronic device (e.g., the wireless power receiver 350) (e.g., the magnetic coupling coefficient between the transmission coil 415a and a reception coil (e.g., the conductive pattern 376 of FIG. 3) of the wireless power receiver), a Z$_{3dB}$ value may be determined in conformance to the reception power specification of the external electronic device (e.g., the wireless power receiver 350) based on the position of the external electronic device (e.g., the wireless power receiver 350). The second inductance value of the feeding coil 413 may be determined such that the proportional constant K$_{Lf}$ (e.g., the ratio of the total inductance value L$_f$ of the feeding coil 413 to the first inductance value L$_{f0}$) and the inductance value (L$_{tx}$) (e.g., 254 nH) of the transmission coil are placed in a specified relationship with the inductance value (e.g., Z$_1$=Z$_{3dB}$) of transmission resonator. More specifically, referring to Equation 16, a K$_{Lf}$ value may be determined based on the inductance value L$_{tx}$ (e.g., 254 nH) of the transmission coil 415a, the determined Z$_{3dB}$ value, and the magnetic coupling coefficient k$_f$. L$_f$ value may be determined based on the determined K$_{Lf}$ value and the L$_{f0}$ value determined by Equation 9. Since the L$_f$ value is the sum of the first inductance value L$_{f0}$ of the first part of the feeding coil 413 and the second inductance value of the second part of the feeding coil 413, the second inductance value (=L$_f$−L$_{f0}$) of the second part may be determined based on the inductance value L$_f$ and the first inductance value L$_{f0}$ of the feeding coil 413.

According to various embodiments, in the wireless power transmitter 300 of FIG. 4, as the magnetic coupling coefficient k$_f$ increases, a maximum efficiency (e.g., a maximum value of the ratio of load power (e.g., power transmitted to the wireless power receiver 350) to input power (power input to the transistor 405)) may decrease, the amount of power at a maximum efficiency point may increase, and an impedance at the maximum efficiency point may decrease. According to various embodiments, in the wireless power transmitter 300, as the inductance value $L_f$ of the feeding coil 413 increases, the amount of power at the maximum efficiency point may increase, and the impedance at the maximum efficiency point may increase. According to various embodiments, when the proportional constant $K_{Lf}$ is greater than 1, the impedance at the maximum efficiency point may be changed from capacitive to inductive, in terms of characteristics.

Figure 6:
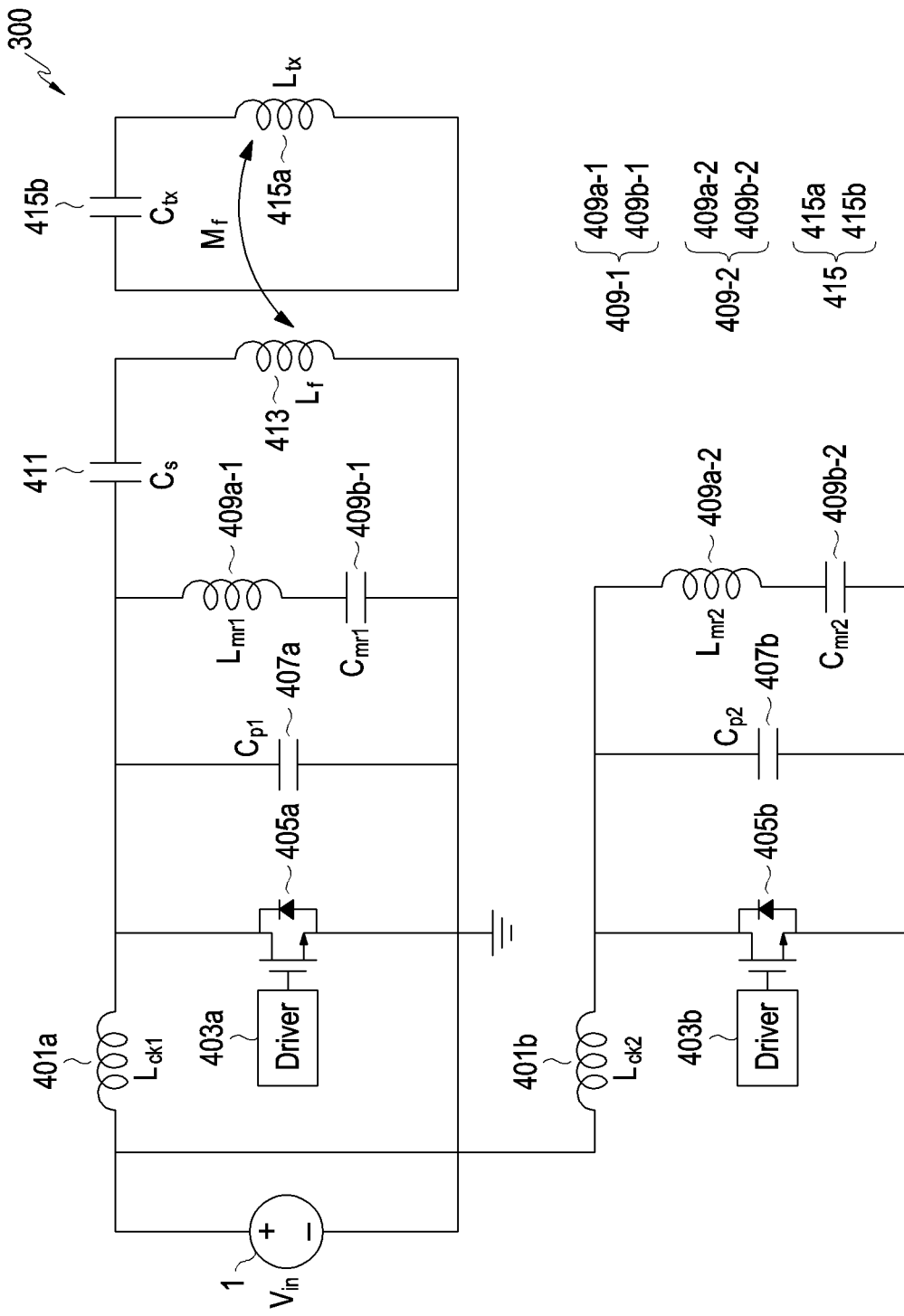
FIG. 6 is a diagram illustrating components of an example wireless power transmitter according to various embodiments.

FIG. 6 is a diagram illustrating components of the example wireless power transmitter 300 according to various embodiments of the disclosure. The components of the wireless power transmitter 300 illustrated in FIG. 6 will be described with reference to FIG. 4 together.

According to various embodiments, the wireless power transmitter 300 may include the input power supply 1 (e.g., the power adapter 321 of FIG. 3), choke inductors $L_{ck1}$ 401a and $L_{ck2}$ 401b (e.g., the choke inductor 401 of FIG. 4), drivers 403a and 403b (e.g., the driver 403 of FIG. 4), transistors 405a and 405b (e.g., the transistor 405 of FIG. 4), first capacitors $C_{P1}$ 407a and $C_{P2}$ 407b (e.g., the first capacitor $C_p$ of FIG. 4), first LC resonant circuits 409-1 and 409-2, the third capacitor $C_s$ 411, the feeding coil 413, and/or the transmission resonator 415.

According to various embodiments, the description of the choke inductor $L_{ck1}$ 401a, the driver 403a, the transistor 405a, the first capacitor $C_{P1}$ 407a, the first LC resonant circuit 409-1 (e.g., a first inductor 409a-1 and a second capacitor 409b-1), the third capacitor $C_s$ 411, the feeding coil 413, and the transmission resonator 415 may be identical to that of the choke inductor $L_{ck1}$ 401, the driver 403, the transistor 405, the first capacitor $C_{P1}$ 407, the first LC resonant circuit 409 (e.g., the first inductor 409a and the second capacitor 409b), the third capacitor $C_s$ 411, the feeding coil 413, and the transmission resonator 415 illustrated in FIG. 4 and will not be repeated here.

Compared to FIG. 4, the wireless power transmitter 300 may be implemented to further include the choke inductor $L_{ck2}$ 401b, the driver 403b, the transistor 405b, the first capacitor $C_{P2}$ 407b, and the first LC resonant circuit 409-2 (e.g., a first inductor 409a-2 and a second capacitor 409b-2) corresponding to the choke inductor $L_{ck}$ 401, the driver 403, the transistor 405, the first capacitor $C_{P1}$ 407, and the first LC resonant circuit 409 (e.g., the first inductor 409a and the second capacitor 409b).

Figure 7:
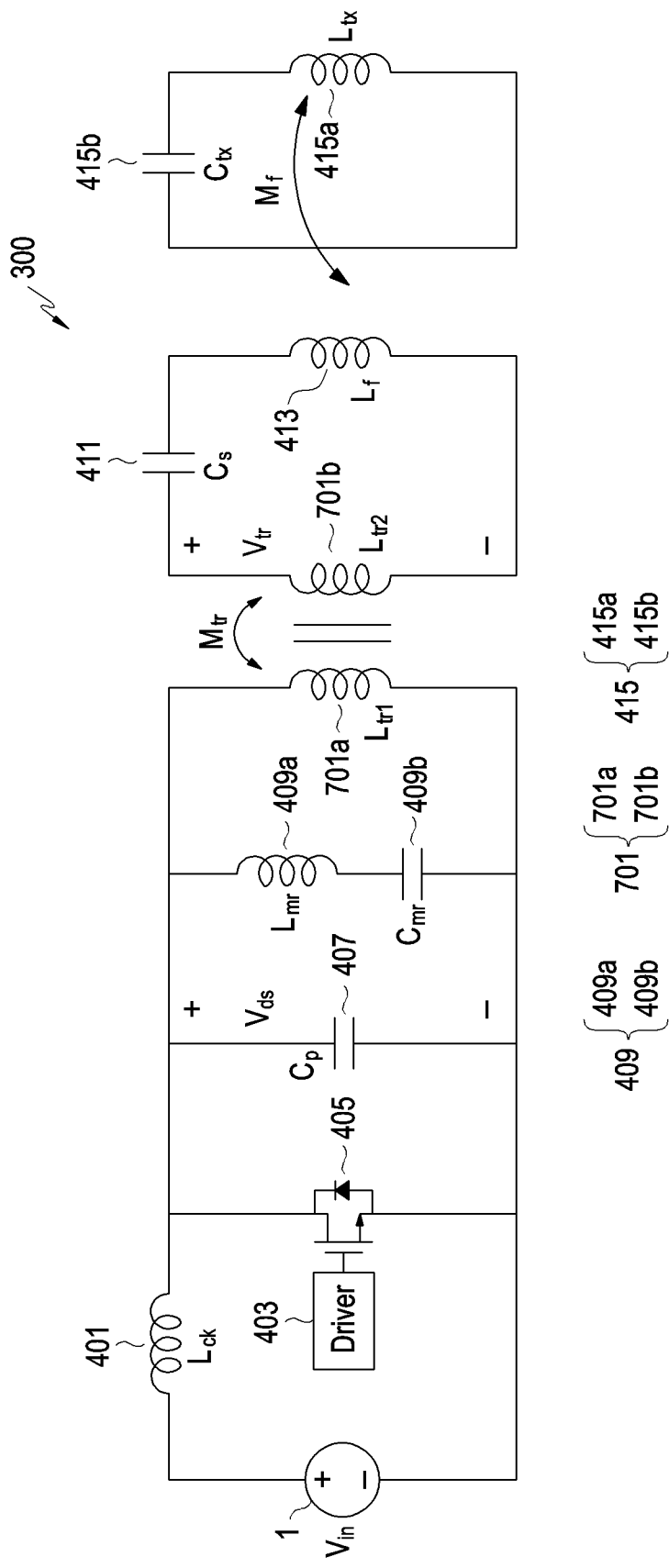
FIG. 7 illustrates another implementation example of a wireless power transmitter.

FIG. 7 illustrates another implementation example of the wireless power transmitter 300. The components of the wireless power transmitter 300 illustrated in FIG. 7 will be described with reference to FIG. 4 together.

According to various embodiments, compared to the wireless power transmitter 300 of FIG. 4, the wireless power transmitter 300 of FIG. 7 may further include a transformer 701 between the first LC resonant circuit 409 and the feeding circuit (e.g., the third capacitor $C_s$ 411 and the feeding coil 413).

According to various embodiments, the transformer 701 may be coupled to the output terminal of the transistor 405, the first capacitor $C_p$ 407, and/or the first LC resonant circuit 409. According to various embodiments, the transformer 701 may include a first coil $L_{tr1}$ 701a and a second coil $L_{tr2}$ 701b. According to various embodiments, the first coil 701a may be coupled to the first LC resonant circuit 409 in parallel. According to various embodiments, the second coil 701b may be coupled to the third capacitor 411 in series. According to various embodiments, the first coil 701a and the second coil 701b may be magnetically coupled to each other. According to various embodiments, at least a part of power output from the transistor 405 may be transferred to the feeding coil 413 based on magnetic coupling between the first coil 701a and the second coil 701b. According to various embodiments, the second coil 701b may be wound on a ferrite core on which the first coil 701a has been wound. For example, the first coil 701a and the second coil 701b may be wound on the same ferrite core. According to various embodiments, '$M_{tr}$' represents a mutual inductance between the first coil 701a and the second coil 701b. According to various embodiments, the first coil 701a and the second coil 701b may be wound on the same ferrite core to have a high magnetic coupling coefficient (e.g., 0.9 or larger). According to various embodiments, the relationship between the output voltage $V_{ds}$ of the PA (e.g., the transistor 405) (e.g., the drain-source voltage of transistor 405) and an output voltage $V_{tr}$ of the transformer 701 may be placed in the relationship described in Equation 17.

$$\frac{V_{tr}}{V_{ds}} \approx \sqrt{\frac{L_{tr2}}{L_{tr1}}} \qquad \text{[Equation 17]}$$

According to various embodiments, the transformer 701 may be disposed on the same PCB as the first LC resonant circuit 409. According to various embodiments, the feeding coil 413 may be disposed outside the PCB. According to various embodiments, since the transformer 701 and the first LC resonant circuit 409 may be disposed on the same PCB, and the feeding coil 413 may be disposed outside the PCB, a shield can may be applied to the PCB (e.g., the shield can may be disposed between the transformer 701 and the third capacitor 411 (or between the third capacitor 411 and the feeding coil 413)). Due to this arrangement structure, it is possible to prevent EMI from affecting the feeding coil 413 and/or the transmission resonator 415.

Figure 8:
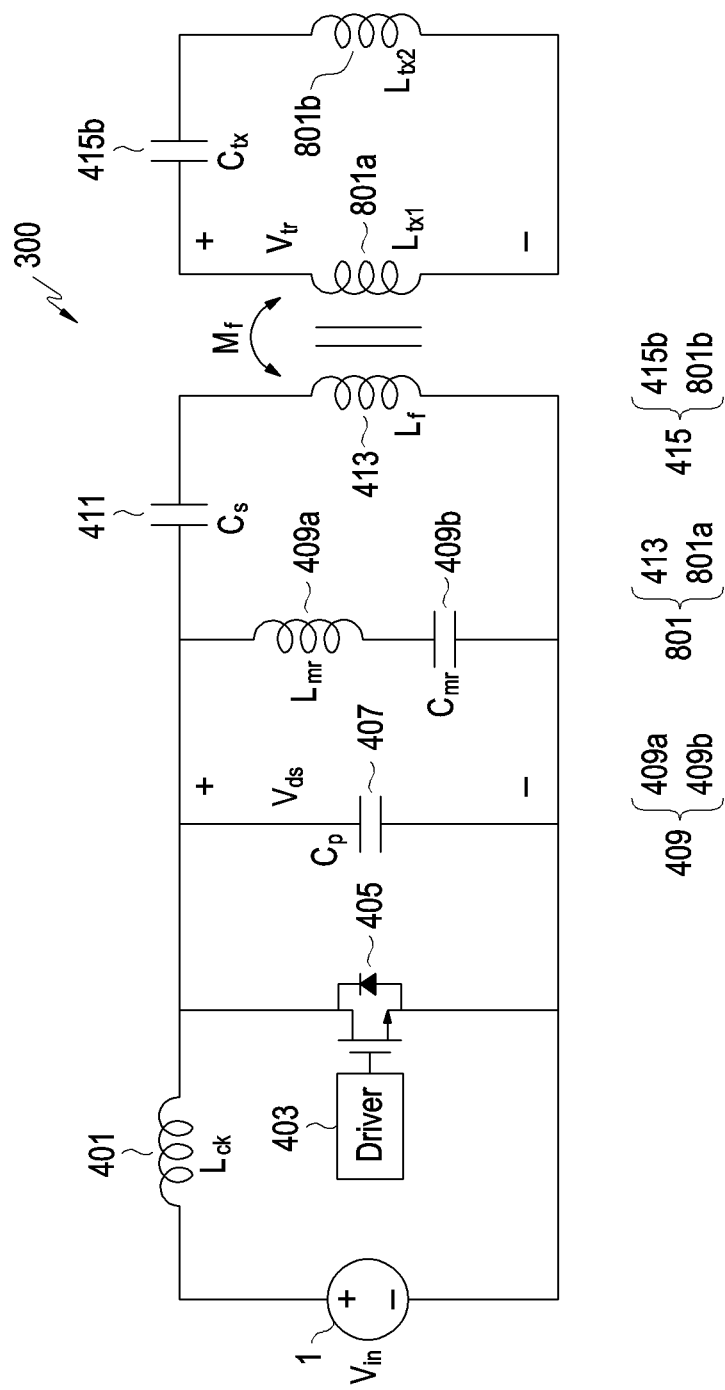
FIG. 8 illustrates another implementation example of a wireless power transmitter.

FIG. 8 illustrates another implementation example of the wireless power transmitter 300. The components of the wireless power transmitter 300 illustrated in FIG. 8 will be described with reference to FIG. 4 together.

According to various embodiments, compared to the wireless power transmitter 300 of FIG. 4, the transmission coil $L_{tx}$ 415 may be implemented as a first coil $L_{tx1}$ 801a and a second coil $L_{tx2}$ 801b, and the feeding coil $L_f$ 413 together with the first coil 801a may form a transformer 801.

According to various embodiments, the transformer 801 may be disposed between the third capacitor 411 and the fourth capacitor 415b. According to various embodiments, the first coil 801a may be coupled with the fourth capacitor 415b in series. According to various embodiments, the fourth capacitor 415b may be disposed between the first coil 801a and the second coil 801b. According to various embodiments, the feeding coil 413 and the first coil 801a may be magnetically coupled to each other. According to various embodiments, at least a part of power output from the transistor 405 may be transmitted to the first coil 801a based on magnetic coupling between the feeding coil 413 and the first coil 801a. According to various embodiments, the first coil 801a may be wound on a ferrite core on which the feeding coil 413 has been wound. For example, the feeding coil 413 and the first coil 801a may be wound on the same ferrite core. According to various embodiments, '$M_f$' represents a mutual inductance between the feeding coil 413 and the first coil 801a. According to various embodiments, the feeding coil 413 and the first coil 801a may be wound on the same ferrite core to have a high magnetic coupling coefficient (e.g., 0.9 or larger). According to various embodiments, the relationship between the output voltage $V_{ds}$ of the PA (e.g., the transistor 405) (e.g., the drain-source voltage of transistor 405) and the output voltage $V_{tr}$ of the transformer 801 may be given as Equation 18.

$$\frac{V_{tr}}{V_{ds}} \approx \sqrt{\frac{L_{tr}}{L_f}} \qquad \text{[Equation 18]}$$

According to various embodiments, the transformer 801 may be disposed on the same PCB as the first LC resonant circuit 409 and/or the third capacitor 411. According to various embodiments, the fourth capacitor $C_{tx}$ 415b and/or the second coil 801b may be disposed outside the PCB. According to various embodiments, because the transformer 801, the first LC resonant circuit 409, and/or the third capacitor 411 may be disposed on the same PCB, and the fourth capacitor 415b and/or the second coil 801b) may be disposed outside the PCB, a shield can may be applied to the PCB (e.g., between the transformer 801 and the fourth capacitor 415b (or between the fourth capacitor 415b and the second coil 801b)). Due to this arrangement structure, it is possible to prevent EMI from affecting the second coil 801b.

According to various embodiments, a wireless power transmitter (e.g., the wireless power transmitter 300 of FIG. 4 or FIG. 8) may include a transistor (e.g., the transistor 405) configured to output an amplified signal based on an input signal and a driving voltage, a first capacitor (e.g., the first capacitor 407 of FIG. 4) coupled to the transistor in parallel, a first LC resonant circuit (e.g., the first LC resonant circuit 409 of FIG. 4) coupled to the transistor in parallel and including a first inductor (e.g., the first inductor 409a of FIG. 4) and a second capacitor (e.g., the second capacitor 409b of FIG. 4) coupled to the first inductor in series, a third capacitor (e.g., the third capacitor 411 of FIG. 4) having one end coupled to an output terminal of the transistor and the first LC resonant circuit, a feeding coil (e.g., the feeding coil 413 of FIG. 4) coupled to the other end of the third capacitor in series, and having at least a part configured to form a second LC resonant circuit with the third capacitor, and a transmission resonator (e.g., the transmission resonator 415 of FIG. 4) including a transmission coil (e.g., the transmission coil 415a of FIG. 4) and a fourth capacitor (e.g., the fourth capacitor 415b of FIG. 4) coupled to the transmission coil in series. At least a part of the transmission coil may be magnetically coupled with the feeding coil, and at least a part of power received from the feeding coil may be output to an outside through the transmission resonator.

According to various embodiments, a resonant frequency of the second LC resonant circuit may correspond to an operating frequency of the input signal, a first part of the feeding coil and the third capacitor may form the second LC resonant circuit, and the first part of the feeding coil may be configured to have a first inductance value (e.g., $L_{f0}$) to make the resonant frequency of the second LC resonant circuit correspond to the operating frequency of the input signal.

According to various embodiments, the second LC resonant circuit may be configured to operate as a band-pass filter at the operating frequency of the input signal.

According to various embodiments, a second inductance value of a second part of the feeding coil may be determined based on at least one of an inductance value (e.g., $L_{tx}$ of FIG. 4 or $L_1$ of FIG. 5A and/or FIG. 5B) of the transmission coil or a magnetic coupling coefficient (e.g., $k_f$) between the transmission coil and the feeding coil.

According to various embodiments, the second inductance value may be determined to place a ratio (e.g., $k_{Lf}$ of the sum (e.g., $L_f$) of the first inductance value and the second inductance value to the first inductance value, the inductance value of the transmission coil, and the magnetic coupling coefficient in a specified relationship with an impedance value of the transmission resonator.

According to various embodiments, the inductance value of the transmission coil is determined based on a distance between the wireless power transmitter and a wireless power receiver (e.g., the wireless power receiver 350 of FIG. 3) disposed outside (e.g., external to) the wireless power transmitter.

According to various embodiments, the transmission coil may include a first coil (e.g., the first coil 801a of FIG. 8) and a second coil (e.g., the second coil 801b of FIG. 8), and the first coil may be magnetically coupled with the feeding coil.

According to various embodiments, the first coil may be wound on a ferrite coil on which the feeding coil is wound.

According to various embodiments, the fourth capacitor (e.g., the fourth capacitor 415b of FIG. 8) may be disposed between the first coil and the second coil.

According to various embodiments, the first LC resonant circuit, the third capacitor, and the first coil may be disposed on the same PCB.

According to various embodiments, the second coil and the fourth capacitor may be disposed outside the PCB.

According to various embodiments, a resonant frequency of the transmission resonator may be set to correspond to an operating frequency of the input signal.

According to various embodiments, the first LC resonant circuit and the third capacitor may be disposed on the same PCB.

According to various embodiments, the feeding coil, the transmission coil, and the fourth capacitor may be disposed outside the PCB.

According to various embodiments, the wireless power transmitter may further include an input power supply (e.g., the input power supply 1 of FIG. 4) configured to supply the driving voltage, and a choke inductor (e.g., the choke inductor 401 of FIG. 4) disposed between the input power supply and an input terminal of the transistor.

According to various embodiments, an inductance value of the choke inductor and a capacitance value of the first capacitor may be set to have a preset ratio based on an operating frequency of the input signal.

According to various embodiments, a wireless power transmitter (e.g., the wireless power transmitter 300 of FIG. 7) may include a transistor (e.g., the transistor 405 of FIG. 7) configured to output an amplified signal based on an input signal and a driving voltage, a first capacitor (e.g., the first capacitor 407 of FIG. 7) coupled to the transistor in parallel, a first LC resonant circuit (e.g., the first LC resonant circuit 409 of FIG. 7) coupled to the transistor in parallel and including a first inductor (e.g., the first inductor 409a of FIG. 7) and a second capacitor (e.g., the second capacitor 409b of FIG. 7) coupled to the first inductor in series, a transformer (e.g., the transformer 701 of FIG. 7) coupled to an output terminal of the transistor and including a first coil (e.g., the first coil 701a of FIG. 7) coupled to the first LC resonant circuit in parallel and a second coil (e.g., the second coil 701b of FIG. 7) wound on a ferrite core on which the first coil is wound, a third capacitor (e.g., the third capacitor 411 of FIG. 7) coupled to the second coil in series, a feeding coil (e.g., the feeding coil 413 of FIG. 7) coupled to the third capacitor in series and configured to form a second LC resonant circuit with the third capacitor, and a transmission resonator (e.g., the transmission resonator 415 of FIG. 7)

including a transmission coil (e.g., the transmission coil 415a of FIG. 7) and a fourth capacitor (e.g., the fourth capacitor 415b of FIG. 7) coupled to the transmission coil in series. At least a part of the transmission coil may be magnetically coupled with the feeding coil, and at least a part of power received from the feeding coil may be output to an outside (e.g., externally) through the transmission resonator.

According to various embodiments, a resonant frequency of the second LC resonant circuit may be set to correspond to an operating frequency of the input signal.

According to various embodiments, at least a part of power output from the transistor may be transmitted to the feeding coil based on magnetic coupling between the first coil and the second coil.

According to various embodiments, the first LC resonant circuit and the transformer may be disposed on the same PCB, and the feeding coil is disposed outside the PCB.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., internal memory or external memory) that is readable by a machine (e.g., the wireless power transmitter 300). For example, a processor of the machine (e.g., the wireless power transmitter 300) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least a part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be avoided, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or avoided, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A wireless power transmitter comprising:
a transistor configured to output an amplified signal based on an input signal and a driving voltage;
a first capacitor coupled to the transistor in parallel;
a first LC resonant circuit coupled to the transistor in parallel and including a first inductor and a second capacitor coupled to the first inductor in series;
a third capacitor having a first end coupled to an output terminal of the transistor and the first LC resonant circuit;
a feeding coil, including a first part and a second part, coupled to a second end of the third capacitor in series, and having at least a part configured to form a second LC resonant circuit with the third capacitor, wherein the first part of the feeding coil and the third capacitor form the second LC resonant circuit, and wherein an inductance value of the second part of the feeding coil is determined based on at least one of an inductance value of the transmission coil or a magnetic coupling coefficient between the transmission coil and the feeding coil; and a transmission resonator including a transmission coil and a fourth capacitor coupled to the transmission coil in series, wherein at least a part of the transmission coil is magnetically coupled with the feeding coil, and wherein at least a part of power received from the feeding coil is output to an outside through the transmission resonator.

2. The wireless power transmitter of claim 1, wherein a resonant frequency of the second LC resonant circuit corresponds to an operating frequency of the input signal, and
wherein the first part of the feeding coil is configured to have a first inductance value to make the resonant frequency of the second LC resonant circuit correspond to the operating frequency of the input signal.

3. The wireless power transmitter of claim 2, wherein the second LC resonant circuit is configured to operate as a band-pass filter at the operating frequency of the input signal.

4. The wireless power transmitter of claim 1, wherein the inductance value of the second part of the feeding coil is determined to place a ratio of a sum of a first inductance value of a first part of the feeding coil and the inductance value of the second part of the feeding coil to the first inductance value, the inductance value of the transmission coil, and the magnetic coupling coefficient in a specified relationship with an impedance value of the transmission resonator.

5. The wireless power transmitter of claim 1, wherein the inductance value of the transmission coil is determined based on a distance between the wireless power transmitter and a wireless power receiver disposed outside the wireless power transmitter.

6. The wireless power transmitter of claim 1, wherein the transmission coil includes a first coil and a second coil, and
wherein the first coil is magnetically coupled with the feeding coil.

7. The wireless power transmitter of claim 6, wherein the first coil is wound on a ferrite core on which the feeding coil is wound.

8. The wireless power transmitter of claim 6, wherein the fourth capacitor is disposed between the first coil and the second coil.

9. The wireless power transmitter of claim 6, wherein the first LC resonant circuit, the third capacitor, and the first coil are disposed on a same printed circuit board (PCB).

10. The wireless power transmitter of claim 9, wherein the second coil and the fourth capacitor are disposed outside the PCB.

11. The wireless power transmitter of claim 1, wherein a resonant frequency of the transmission resonator is set to correspond to an operating frequency of the input signal.

12. The wireless power transmitter of claim 1, wherein the first LC resonant circuit and the third capacitor are disposed on a same printed circuit board (PCB).

13. The wireless power transmitter of claim 12, wherein the feeding coil, the transmission coil, and the fourth capacitor are disposed outside the PCB.

14. The wireless power transmitter of claim 1, further comprising:
an input power supply configured to supply the driving voltage; and
a choke inductor disposed between the input power supply and an input terminal of the transistor.

15. The wireless power transmitter of claim 14, wherein an inductance value of the choke inductor and a capacitance value of the first capacitor are set to have a preset ratio based on an operating frequency of the input signal.

16. A wireless power transmitter comprising:
a transistor configured to output an amplified signal based on an input signal and a driving voltage;
a first capacitor coupled to the transistor in parallel;
a first LC resonant circuit coupled to the transistor in parallel and including a first inductor and a second capacitor coupled to the first inductor in series;
a transformer coupled to an output terminal of the transistor and including a first coil coupled to the first LC resonant circuit in parallel and a second coil wound on a ferrite core on which the first coil is wound;
a third capacitor coupled to the second coil in series;
a feeding coil, including a first part and a second part, coupled to the third capacitor in series and configured to form a second LC resonant circuit with the third capacitor, wherein the first part of the feeding coil and the third capacitor form the second LC resonant circuit, and wherein an inductance value of the second part of the feeding coil is determined based on at least one of an inductance value of the transmission coil or a magnetic coupling coefficient between the transmission coil and the feeding coil; and
a transmission resonator including a transmission coil and a fourth capacitor coupled to the transmission coil in series,
wherein at least a part of the transmission coil is magnetically coupled with the feeding coil, and
wherein at least a part of power received from the feeding coil is output to an outside through the transmission resonator.

17. The wireless power transmitter of claim 16, wherein a resonant frequency of the second LC resonant circuit is set to correspond to an operating frequency of the input signal.

18. The wireless power transmitter of claim 16, wherein at least a part of power output from the transistor is transmitted to the feeding coil based on magnetic coupling between the first coil and the second coil.

19. The wireless power transmitter of claim 16, wherein the first LC resonant circuit and the transformer are disposed on a same printed circuit board (PCB), and the feeding coil is disposed outside the PCB.

* * * * *